US008341586B2

(12) United States Patent
Frankle et al.

(10) Patent No.: US 8,341,586 B2
(45) Date of Patent: Dec. 25, 2012

(54) METHOD AND SYSTEM FOR ROUTING

(75) Inventors: Jonathan Frankle, Los Gatos, CA (US); John H. Gilchrist, III, Cupertino, CA (US); Anish Malhotra, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 217 days.

(21) Appl. No.: 12/611,560

(22) Filed: Nov. 3, 2009

(65) Prior Publication Data

US 2010/0050143 A1    Feb. 25, 2010

Related U.S. Application Data

(60) Division of application No. 11/751,526, filed on May 21, 2007, now Pat. No. 7,624,367, and a continuation-in-part of application No. 10/335,180, filed on Dec. 31, 2002, now Pat. No. 7,480,885.

(60) Provisional application No. 60/877,942, filed on Dec. 29, 2006, provisional application No. 60/427,131, filed on Nov. 18, 2002.

(51) Int. Cl.
*G06F 17/50* (2006.01)
(52) U.S. Cl. ......... 716/126; 716/118; 716/119; 716/137
(58) Field of Classification Search ................... 716/118, 716/119, 126, 137
See application file for complete search history.

(56) References Cited

U.S. PATENT DOCUMENTS

| | | |
|---|---|---|
| 4,593,363 A | 6/1986 | Burstein et al. |
| 4,615,011 A | 9/1986 | Linsker |
| 4,673,966 A | 6/1987 | Shimoyama |
| 4,777,606 A | 10/1988 | Fournier |
| 4,782,193 A | 11/1988 | Linsker |
| 4,855,929 A | 8/1989 | Nakajima |
| 5,097,422 A | 3/1992 | Corbin, II et al. |
| 5,224,057 A | 6/1993 | Igarashi et al. |
| 5,251,147 A | 10/1993 | Finnerty |
| 5,267,176 A | 11/1993 | Antreich et al. |
| 5,281,151 A | 1/1994 | Arima et al. |
| 5,360,948 A | 11/1994 | Thornberg |

(Continued)

FOREIGN PATENT DOCUMENTS

JP    64-015947    1/1989

(Continued)

OTHER PUBLICATIONS

NN8407978, "Wire Routing Subject to Constraints", Jul. 1, 1984, IBM Technical Disclosure Bulletin, vol. No. 27, Issue No. 2, p. No. 978-982.

(Continued)

*Primary Examiner* — Thuan Do
*Assistant Examiner* — Brian Ngo
(74) *Attorney, Agent, or Firm* — Vista IP Law Group, LLP

(57) ABSTRACT

Disclosed is a method, system, and computer program product for routing, modeling routes, and measuring congestion. In some embodiments, Gcells are implemented with reduced number of nodes to facilitate route modeling and congestion measurement. Some embodiments are particularly suitable for direct congestion and routing analysis of diagonal routing paths. In this way, congestion analysis can be directly performed along diagonal boundaries for diagonal routes, without requiring association with Gcell boundaries on Manhattan routing layers.

22 Claims, 39 Drawing Sheets

U.S. PATENT DOCUMENTS

| | | | |
|---|---|---|---|
| 5,375,069 A | 12/1994 | Satoh et al. |
| 5,519,836 A | 5/1996 | Gawlick et al. |
| 5,532,934 A | 7/1996 | Rostoker |
| 5,566,078 A | 10/1996 | Ding et al. |
| 5,578,840 A | 11/1996 | Scepanovic et al. |
| 5,587,923 A | 12/1996 | Wang |
| 5,618,744 A | 4/1997 | Suzuki et al. |
| 5,633,479 A | 5/1997 | Hirano |
| 5,634,093 A | 5/1997 | Ashida et al. |
| 5,635,736 A | 6/1997 | Funaki et al. |
| 5,636,125 A | 6/1997 | Rostoker et al. |
| 5,637,920 A | 6/1997 | Loo |
| 5,640,327 A | 6/1997 | Ting |
| 5,650,653 A | 7/1997 | Rostoker et al. |
| 5,657,242 A | 8/1997 | Sekiyama et al. |
| 5,663,891 A | 9/1997 | Bamji et al. |
| 5,673,201 A | 9/1997 | Malm et al. |
| 5,699,265 A | 12/1997 | Scepanovic et al. |
| 5,723,908 A | 3/1998 | Fuchida et al. |
| 5,742,086 A | 4/1998 | Rostoker et al. |
| 5,757,089 A | 5/1998 | Ishizuka |
| 5,757,656 A | 5/1998 | Hershberger et al. |
| 5,777,360 A | 7/1998 | Rostoker et al. |
| 5,784,289 A | 7/1998 | Wang |
| 5,798,936 A | 8/1998 | Cheng |
| 5,801,959 A * | 9/1998 | Ding et al. ............... 716/119 |
| 5,811,863 A | 9/1998 | Rostoker et al. |
| 5,822,214 A | 10/1998 | Rostoker et al. |
| 5,838,583 A | 11/1998 | Varadarajan et al. |
| 5,859,449 A | 1/1999 | Kobayashi et al. |
| 5,889,677 A | 3/1999 | Yasuda et al. |
| 5,898,597 A | 4/1999 | Scepanovic et al. |
| 5,914,887 A | 6/1999 | Scepanovic et al. |
| 5,973,376 A | 10/1999 | Rostoker et al. |
| 5,980,093 A | 11/1999 | Jones et al. |
| 6,035,108 A | 3/2000 | Kikuchi |
| 6,038,385 A | 3/2000 | Scepanovic et al. |
| 6,058,254 A | 5/2000 | Scepanovic et al. |
| 6,067,409 A | 5/2000 | Scepanovic et al. |
| 6,068,662 A | 5/2000 | Scepanovic et al. |
| 6,070,108 A | 5/2000 | Andreev et al. |
| 6,088,519 A | 7/2000 | Koford |
| 6,123,736 A | 9/2000 | Pavisic et al. |
| 6,128,767 A | 10/2000 | Chapman |
| 6,150,193 A | 11/2000 | Glenn |
| 6,154,874 A | 11/2000 | Scepanovic et al. |
| 6,155,725 A | 12/2000 | Scepanovic et al. |
| 6,175,950 B1 | 1/2001 | Scepanovic et al. |
| 6,209,123 B1 | 3/2001 | Maziasz et al. |
| 6,216,252 B1 | 4/2001 | Dangelo et al. |
| 6,219,832 B1 | 4/2001 | Buzbee |
| 6,226,560 B1 | 5/2001 | Hama et al. |
| 6,230,306 B1 | 5/2001 | Raspopovic et al. |
| 6,240,541 B1 | 5/2001 | Yasuda et al. |
| 6,240,542 B1 | 5/2001 | Kapur |
| 6,247,167 B1 | 6/2001 | Raspopovic et al. |
| 6,249,902 B1 | 6/2001 | Igusa et al. |
| 6,253,363 B1 | 6/2001 | Gasanov et al. |
| 6,260,179 B1 | 7/2001 | Ohsawa et al. |
| 6,262,487 B1 | 7/2001 | Igarashi et al. |
| 6,289,495 B1 | 9/2001 | Raspopovic et al. |
| 6,295,634 B1 | 9/2001 | Matsumoto |
| 6,301,686 B1 | 10/2001 | Kikuchi et al. |
| 6,307,256 B1 | 10/2001 | Chiang et al. |
| 6,316,838 B1 | 11/2001 | Ozawa et al. |
| 6,324,674 B2 | 11/2001 | Andreev et al. |
| 6,324,675 B1 | 11/2001 | Dutta et al. |
| 6,327,693 B1 | 12/2001 | Cheng et al. |
| 6,327,694 B1 | 12/2001 | Kanazawa |
| 6,330,707 B1 | 12/2001 | Shinomiya et al. |
| 6,349,403 B1 | 2/2002 | Dutta et al. |
| 6,353,918 B1 | 3/2002 | Carothers et al. |
| 6,366,279 B1 | 4/2002 | Gorman |
| 6,378,121 B2 | 4/2002 | Hiraga |
| 6,385,758 B1 | 5/2002 | Kikuchi et al. |
| 6,401,234 B1 | 6/2002 | Alpert et al. |
| 6,405,358 B1 | 6/2002 | Nuber |
| 6,407,434 B1 | 6/2002 | Rostoker et al. |
| 6,412,097 B1 | 6/2002 | Kikuchi et al. |
| 6,412,102 B1 | 6/2002 | Andreev et al. |
| 6,415,422 B1 | 7/2002 | Mehrotra et al. |
| 6,436,804 B2 | 8/2002 | Igarashi et al. |
| 6,442,743 B1 | 8/2002 | Sarrafzadeh et al. |
| 6,442,745 B1 | 8/2002 | Arunachalam et al. |
| 6,446,245 B1 | 9/2002 | Xing et al. |
| 6,448,591 B1 | 9/2002 | Juengling |
| 6,463,575 B1 | 10/2002 | Takahashi |
| 6,473,891 B1 | 10/2002 | Shively |
| 6,480,991 B1 | 11/2002 | Cho et al. |
| 6,490,713 B2 | 12/2002 | Matsumoto |
| 6,505,331 B1 | 1/2003 | Bracha et al. |
| 6,516,455 B1 | 2/2003 | Teig et al. |
| 6,519,751 B2 | 2/2003 | Sriram et al. |
| 6,543,035 B2 | 4/2003 | Ohba et al. |
| 6,543,043 B1 | 4/2003 | Wang et al. |
| 6,546,540 B1 | 4/2003 | Igarashi et al. |
| 6,557,145 B2 | 4/2003 | Boyle et al. |
| 6,567,967 B2 | 5/2003 | Greidinger et al. |
| 6,571,379 B2 | 5/2003 | Takayama |
| 6,601,227 B1 | 7/2003 | Trimberger |
| 6,611,946 B1 | 8/2003 | Richardson et al. |
| 6,618,846 B2 | 9/2003 | Cheng |
| 6,618,849 B2 | 9/2003 | Teig et al. |
| 6,651,233 B2 | 11/2003 | Teig et al. |
| 6,671,864 B2 | 12/2003 | Teig et al. |
| 6,687,893 B2 | 2/2004 | Teig et al. |
| 6,738,960 B2 | 5/2004 | Teig et al. |
| 6,851,099 B1 | 2/2005 | Sarrafzadeh et al. |
| 6,892,369 B2 | 5/2005 | Teig et al. |
| 6,892,372 B2 | 5/2005 | Deura |
| 6,988,257 B2 | 1/2006 | Teig et al. |
| 6,996,789 B2 | 2/2006 | Teig et al. |
| 7,003,752 B2 | 2/2006 | Teig et al. |
| 7,010,771 B2 | 3/2006 | Teig et al. |
| 7,080,342 B2 | 7/2006 | Teig et al. |
| 7,107,564 B1 | 9/2006 | Teig et al. |
| 7,117,468 B1 * | 10/2006 | Teig et al. ............... 716/129 |
| 7,171,635 B2 | 1/2007 | Teig et al. |
| 2001/0003843 A1 | 6/2001 | Scepanovic et al. |
| 2001/0009031 A1 | 7/2001 | Nitta et al. |
| 2002/0069397 A1 | 6/2002 | Teig et al. |
| 2002/0100007 A1 | 7/2002 | Teig et al. |
| 2002/0120913 A1 | 8/2002 | Suzuki et al. |
| 2002/0124231 A1 | 9/2002 | Teig et al. |
| 2002/0133798 A1 | 9/2002 | Teig et al. |
| 2002/0147958 A1 | 10/2002 | Teig et al. |
| 2002/0157075 A1 | 10/2002 | Teig et al. |
| 2002/0166105 A1 * | 11/2002 | Teig et al. ............... 716/14 |
| 2002/0170027 A1 | 11/2002 | Teig et al. |
| 2002/0182844 A1 | 12/2002 | Igarashi et al. |
| 2002/0199165 A1 | 12/2002 | Teig et al. |
| 2003/0005399 A1 | 1/2003 | Igarashi et al. |
| 2003/0014725 A1 | 1/2003 | Sato et al. |
| 2003/0018947 A1 | 1/2003 | Teig et al. |
| 2003/0025205 A1 | 2/2003 | Shively |
| 2003/0028853 A1 | 2/2003 | Deura |
| 2003/0043827 A1 | 3/2003 | Teig et al. |
| 2003/0056187 A1 | 3/2003 | Teig et al. |
| 2003/0063568 A1 | 4/2003 | Teig et al. |
| 2003/0063614 A1 | 4/2003 | Teig et al. |
| 2003/0064559 A1 | 4/2003 | Teig et al. |
| 2003/0066042 A1 | 4/2003 | Teig et al. |
| 2003/0066043 A1 | 4/2003 | Teig et al. |
| 2003/0066044 A1 | 4/2003 | Teig et al. |
| 2003/0079193 A1 | 4/2003 | Teig et al. |
| 2003/0088841 A1 | 5/2003 | Teig et al. |
| 2003/0088844 A1 | 5/2003 | Teig et al. |
| 2003/0088845 A1 | 5/2003 | Teig et al. |
| 2003/0101428 A1 | 5/2003 | Teig et al. |
| 2003/0121017 A1 | 6/2003 | Andreev et al. |
| 2003/0192021 A1 | 10/2003 | Teig et al. |
| 2003/0217346 A1 | 11/2003 | Teig et al. |
| 2004/0044979 A1 | 3/2004 | Aji et al. |
| 2004/0049754 A1 | 3/2004 | Liao et al. |
| 2004/0098680 A1 | 5/2004 | Teig et al. |
| 2004/0098691 A1 | 5/2004 | Teig et al. |
| 2004/0098694 A1 | 5/2004 | Teig et al. |

| | | | |
|---|---|---|---|
| 2004/0098695 | A1 | 5/2004 | Teig et al. |
| 2004/0098696 | A1 | 5/2004 | Teig et al. |
| 2004/0098698 | A1 | 5/2004 | Teig et al. |
| 2004/0103387 | A1* | 5/2004 | Teig et al. ............... 716/13 |
| 2004/0145033 | A1 | 7/2004 | McElvain |

FOREIGN PATENT DOCUMENTS

| | | |
|---|---|---|
| JP | 03-173471 | 7/1991 |
| JP | 04-000677 | 1/1992 |
| JP | 05-102305 | 4/1993 |
| JP | 05-243379 | 9/1993 |
| JP | 07-086407 | 3/1995 |
| JP | 09-132279 | 6/1997 |
| JP | 11-296560 | 10/1999 |
| JP | 200082743 | 3/2000 |

OTHER PUBLICATIONS

NNRD454151, "Congestion Driven Placement System Using Mid-Cut Partitioning", Feb. 1, 2002, IBM technical Disclosure Bulletin, Issue No. 454, p. No. 318.

Lou et al., "Estimating routing congestion using probabilistic analysis", Jan. 2002, Computer-Aided Design of Integrated Circuits and Systems, IEEE Transactions on, vol. 21, Issue 1, pp. 32-41.

Tseng et al., "A gridless multilayer router for standard cell circuits using CTM cells", Oct. 1999, Computer-Aided Design of Integrated Circuits and Systems, IEEE Transactions on, vol. 18, Issue 10, pp. 1462-1479.

Zhang et al., "A gridless router based on hierarchical PB corner stitching structure", Jun. 29-Jul. 1, 2002, Communications, Circuits and Systems and West Sino Expositions, International Conference on, vol. 2, pp. 1438-1443 vol. 2.

Wang et al., "Modeling and minimization of routing congestion", Jan. 25-28, 2000, Design Automation Conference, Proceedings of the ASP-DAC 2000. Asia and South Pacific, pp. 185-190.

Cong et al., "Performance driven multi-layer general area routing for PCB/MCM designs", Jun. 15-19, 1998, Design Automation Conference, Proceedings, pp. 356-361.

Cho J.D., Wiring Space and Length Estimation in Two-Dimensional Arrays, May 2000, Computer-Aided Design of Integrated Circuits and Systems, IEEE Transactions on, vol. 19, Iss. 5, pp. 612-615.

Cong J. et al., DUNE—A Multilayer Gridless Routing System, May 2001, IEEE Transactions on Computer-Aided Design of Integrated Circuits and Systems, vol. 20, iss. 5, pp. 633-647. cited by other.

Dion J. et al., Contour: A Tile-based Gridless Router, Mar. 1995, Digital Western Research Laboratory, research Report 95-3, pp. 1-22. cited by other.

Schulz U., Hierarchical Physical Design System, CompEuro '89, VLSI and Computer Peripherals. VSLI and Microelectronic Applications in Intelligent Peripherals and their Interconnection Networks. Proceedings, May 8-12, 1989, pp. 5/20-5/24. cited by other.

Tseng H-P. et al., A Gridless Multilayer Router for Standard Cell Circuits Using CTM Cells, Oct. 1999, IEEE Transactions on Computer-Aided Design of Integrated Circuits and Systems, vol. 18, iss. 10, pp. 1462-1479. cited by other.

U.S. Appl. No. 09/737,245, filed Dec. 13, 2000, Steven Teig et al. cited by other.

U.S. Appl. No. 09/739,589, filed Dec. 15, 2000, Steven Teig et al. cited by other.

Ahuja, A. et al., Faster Algorithms for the Shortest Path Problem, Journal of the Association for Computing Machinery, vol. 37, No. 2, Apr. 1990, pp. 213-223. cited by other.

Alexander, M. et al., Performance-Oriented Placement and Routing for field-programmable gate arrays, Proceedings of the European Design Automation Conference, pp. 80-85, 1995. cited by other.

Alexander, M. et al., Placement and Routing for Performance-Oriented FPGA Layout, VLSI Design, vol. 7, No. 1, 1998. cited by other.

Berger, B. et al., Nearly Optimal Algorithms and Bounds for Multilayer Channel Routing, Journal of the Association for Computing Machinery, pp. 500-542, Mar. 1995. cited by other.

Brady, L. et al., Channel Routing on a 60.degree. Grid, extended abstract, pp. 926-931. cited by other.

Brambilla, A. et al., Statistical Method for the Analysis of Interconnects Delay in Submicrometer Layouts, IEEE, Aug. 2001, pp. 957-966. cited by other.

Carothers, K., A Method of Measuring Nets Routability for MCM's General Area Routing Problems, 1999, pp. 186-192. cited by other.

Chen et al., Optimal Algorithms for Bubble Sort Based Non-Manhattan Channel Routing, May 1994, Computer-Aided Design of Integrated Circuits and Systems, IEEE Transactions vol. 13 Issues, pp. 603-609. cited by other.

Chen, H. et al., Physical Planning of On-Chip Interconnect Architectures, 2002, IEEE, International Conference, pp. 30-35. cited by other.

Chen, H., Routing L-Shaped Channels in Nonslicing-Structure Placement, 24th ACM-IEEE Design Automation Conference, pp. 152-165, 1987. cited by other.

Cheng, K. et al., Manhattan or Non Manhattan? A Study of Alternative VLSI Routing Architectures, pp. 47-52, 2000. cited by other.

Cheng, K., Steiner Problem in Octilinear Routing Model, A Thesis submitted for the Degree of Master of Science, National University Singapore, 1995, pp. 1-122. cited by other.

Chiang, C. et al., Wirability of Knock-Knee Layouts with 45.degree. Wires, IEEE Transactions on Circuits and Systems, vol. 38, Issue 6, pp. 613-624, Jun. 1991. cited by other.

Chip Model with Wiring Cost Map, Aug. 1983, IBM Technical Disclosure Bulletin, vol. 26, issu. 3A, pp. 929-933. cited by other.

Cho, J. et al., Four-Bend Top Down Global Routing, IEEE, pp. 793-802, 1998. cited by other.

Cong, J. et al., Efficient Heuristics for the Minimum Shortest Path Steiner Arborescence Problem with Applications to VLSI Physical Design, Cadence Design Systems, pp. 88-95. cited by other.

Cong, J. et al., Multilevel Approach to Full Chip Gridless Routing, Nov. 2001, IEEE, pp. 396-403. cited by other.

Cong, J. et al., Performance Driven Multi-Layer General Routing for PCB/MCM Designs, UCLA Computer Science Department, 1998, pp. 356-361. cited by other.

Das, S. et al., Channel Routing in Manhattan—Diagonal Model, 9th International Conference on VLSI Design, Jan. 1996. pp. 43-48. cited by other.

Das, S. et al., Routing of L-Shaped Channels, Switchboxes and Staircases in Manhattan—Diagonal Model, pp. 65-70, Jan. 1998. cited by other.

Deguchi et al., Timing-driven Hierarchical Global Routing with Wire-Sizing and Buffer-Insertion for VLSI Multi-Routing Layer, IEEE, Jan. 28, 2000, pp. 99-104. cited by other.

Dood, P. et al, A Two-Dimensional Topological Compactor with Octagonal Geometry, 28th ACM/IEEE Design Automation Conference, pp. 727-731, Jul. 1991. cited by other.

Dutt, S. et al., Probability-Based Approach to VLSI Circuit Partitioning, IEEE Trans. on Computer-Aided Design of IC's and Systems, vol. 19, No. 5, May 2000, pp. 534-549. cited by other.

Enbody, R. et al., Near-Optimal n-Layer Channel Routing, 23rd Design Automation Conference, 1986, pp. 708-714. cited by other.

Fang, S. et al., Constrained Via Minimization with Practical Considerations for Multi-Layer VLSI/PCB Routing Problem, 28th ACM/IEEE Design Automation Conference, 1991, pp. 60-65. cited by other.

Farrahi, A. H. et al., Quality of EDA CAD Tools: Definitions, Metrics and Directions, Quality Electronic Design, 2000, Proceedings of the first International Symposium on Mar. 2000, pp. 395-405. cited by other.

Gonzalez et al., Multiterminal-net routing by grid stretching, Sep. 17-19, 1990, Computer Design: VLSI in Computers and Processors, 1990. ICCD '90. Proceedings, 1990 IEEE International Conference, pp. 396-399. cited by other.

Hachtel, G.D. et al., Linear Complexity Algorithms for Hierarchical Routing, Jan. 1989, IEEE pp. 64-80. cited by other.

Hom, I. et al., Estimation of the Number of Routing Layers and Total Wirelength in a PCB Through Wiring Distribution Analysis, 1996, pp. 1-6. cited by other.

Hong, X. et al., Performance-Driven Steiner Tree Algorithms for Global Routing, 30th ACM/IEEE Design Automation Conference, 1993, pp. 177-181. cited by other.

Hu, J.et al., A Timing-Constrained Algorithm for Simultaneous Global Routing of Multiple Nets, IEEE/ACM International Conference on Computer Aided Design. ICCAD—2000. IEEE/ACM Digest of Technical Papers (Cat. No. 00CH37140), Proceedings of International Conference on Computer Aided Design (ICCAD), San Jose, CA, USA, Nov. 5-9, 2000, pp. 99-103. cited by other.

IBM Technical Bulletin, Wiring multimode nets, Dec. 1, 1983, IBM, vol. 26, issue 7B, pp. 3895-1900. cited by other.

Igarashi, M. et al., A Diagonal-Interconnect Architecture and Its Application to RISC Core Design, 2002 IEEE Solid-State Circuits Conference, pp. 210-460, Feb. 2002. cited by other.

Kastner, R. et al, Predictable Routing, IEEE/ACM International Conference on Computer Aided Design. ICCAD—2000. IEEE/ACM Digest of Technical Papers (CAT. No. 00CH37140), Proceedings of International Conference on Computer Aided Design (ICCAD), San Jose, CA, USA, Nov. 5-9, 2000. pp. 110-113. cited by other.

Khoo, K.et al., An Efficient Multilayer MCM Router Based on Four-Via Routing, 30th ACM/IEEE Design Automation Conference, 1993, pp. 590-595. cited by other.

Leiserson, C. et al., Algorithms for Routing and Testing Routability of Planar VLSI Layouts, pp. 69-78, May 1985. cited by other.

Lillis, J. et al., Table-Lookup Methods for Improved Performance-Driven Routing, 1998, pp. 368-373. cited by other.

Lipski, W. et al., A Unified Approach to Layout Wirability, Mathimatical Systems Theory, 1987, pp. 189-203. cited by other.

Lodi, E. et al., A 2d Channel Router for the Diagonal Model, pp. 111-125, Apr. 1991. cited by other.

Lodi, E. et al., A Preliminary Study of a Diagonal Channel-Routing Model, Algorithmica, 1989, pp. 585-597. cited by other.

Lodi, E. et al., Lecture Notes in Computer Science, A 4d Channel Router for a Two Layer Diagonal Model, pp. 464-476, Jul. 1988. cited by other.

Lodi, E. et al., Routing in Times Square Mode, pp. 41-48, Jun. 1990. cited by other.

Lodi, E. et al., Routing Multiterminal Nets in a Diagonal Model, pp. 899-902, 1988. cited by other.

Naclerio, N. et al., Via Minimization for Gridless Layouts, 24th ACM/IEEE Design Automation Conference, 1987, pp. 159-165. cited by other.

Nam, G. et al, Satisfiability-Based Layout Revisited: Detailed Routing of Complex FPGAs Via Search-Based Boolean SAT, 1999, pp. 167-175. cited by other.

Nestor, J., A New Look at Hardware Maze Routing, Proceedings of the 12th ACM Symposium on Great Lakes Symposium on VLSI, pp. 142-147, Apr. 2002. cited by other.

Oh, J. et al., Constructing Lower and Upper Bounded Delay Routing Trees Using Linear Programming, 33rd Design Automation Conference, 1996. cited by other.

Overtone, G., EDA Underwriter 2 Finding Space in a Multi-layer Board, Electronic Engineering, Morgan-Grampian Ltd, vol. 67, No. 819, pp. 29-30. cited by other.

Parakh, P. et al., Congestion Driven Quadratic Placement, Proceedings of Design Automation Conference, 1998, pp. 275-278. cited by other.

Partitioning Logic on to Graph Structure, IBM Technical Disclosure Bulletin, Feb. 1990, vol. 32, iss. 9A, pp. 469-475. cited by other.

Phillips, N., Channel Routing by Constraint Logic, Department of Computer Science Southern Illinois University, ACM, 1992. cited by other.

Powers, K. et al., The 60.degree. Grid: Routing Channels in Width d/square root 3, VLSI, 1991, Proceedings., First Great Lakes Symposium on Kalamazoo, MI, USA, pp. 214-291, Mar. 1991. cited by other.

Putatunda, R. et al., Vital: Fully Automatic Placement Strategies for Very Large Semicustom Designs, Proceedings of the International Conference on Computer Design: VLSI in Computers and Processors, pp. 434-439 Oct. 1988. cited by other.

Schiele, W. et al., A Gridless Router for Industrial Design Rule, 27th ACM-IEEE Design Automation Conference, pp. 626-631, 1990. cited by other.

Sekiyama, Y. et al., Timing-Oriented Routers for PCB Layout Design of High-Performance Computers, International Conference on Computer Aided Design, pp. 332-335, Nov. 1991. cited by other.

Staepelaere, D. et al., Surf: A Rubber-Band Routing System for Multichip Modules, pp. 18-26, 1993. cited by other.

Su, J. et al., Post-Route Optimization for Improved Yield Using Rubber-Band Wiring Model, 1997 International Conference on Computer-Aided Design, pp. 700-706, Nov. 1997. cited by other.

Takashima, Y. et al, Routability of FPGAs with Extremal Switch-Block Structures, IEICE Trans. Fundamentals, vol. E81-A, No. 5, May 1998, pp. 850-856. cited by other.

Thakur, S. et al., Algorithms for a Switch Module Routing Problem, 1994, pp. 265-270. cited by other.

Theune, D. et al., HERO: Hierarchical EMC-constrained routing, Nov. 1992, IEEE pp. 468-472. cited by other.

Tollis, I., Techniques for Wiring in Non-Square Grids, pp. 66-69, May 1989. cited by other.

Tseng, H., Timing and Crosstalk Driven Area Routing, pp. 378-381. cited by other.

Vannelli, A. et al., An adaptation of the interior point method for solving the global routing problem, Feb. 1991, IEEE pp. 193-203. cited by other.

Vicente, J. RSR: A New Rectilinear Steiner Minimum Tree Approximation for FPGA Placement and Global Routing, Proceedings of the 24.sup.th Euro Micro Conference, pp. 192-195, Aug. 1998. cited by other.

Wang, D., Novel Routing Schemes for IC Layout, Part I: Two-Layer Channel Routing, 28th ACM/IEEE Automation Conference, 1991, pp. 49-53. cited by other.

Wang, M. et al., Modeling and Minimization of Routing Congestion, Jan. 2000, IEEE proceedings of ASP-DAC, Asia and South Pacific, pp. 185-190. cited by other.

Wei-Ming Dai, W. et al., Routability of a Rubber-Band Sketch, 28th ACM-IEEE Design Automation Conference, 1991. pp. 45-65. cited by other.

Wood, G. et al., FPGA Routing and Routability Estimation Via Boolean Satisfiability, Department of Electrical and Computer Engineering Carnegie Mellon University, Pittsburgh, PA, pp. 119-125. cited by other.

Yan et al., Three-Layer Bubble-Sorting—Based Non-Manhattan Channel Routing, ACM Transactions on Design Automation of Electronic Systems, vol. 5, No. 3, Jul. 2000, pp. 726-734. cited by other.

Zhang, C.X. et al., Floorplan Design Using a Hierarchical Neutral Learning Algorithm, IEEE, Jun. 1991, pp. 2060-2063. cited by other.

Zhou, H. et al., An Optimal Algorithm for River Routing with Crosstalk Constraints, 1996. cited by other.

Zhou, H. et al., Optimal River Routing with Crosstalk Constraints, ACM Transactions on Design Automation of Electronic Systems, vol. 3, No. 3, Jul. 1998, pp. 495-514. cited by other.

Zhou, H. et al.,Global Routing with Crosstalk Constraints, Department of Computer Sciences, University of Texas, 1998, pp. 374-377. cited by other.

\* cited by examiner

METHOD AND SYSTEM FOR ROUTING

CROSS-REFERENCE TO RELATED APPLICATIONS

This application is a division of U.S. non-provisional patent application Ser. No. 11/751,526, now U.S. Pat. No. 7,624,367, filed May 21, 2007, which claims the benefit of U.S. provisional application Ser. No. 60/877,942, filed on Dec. 29, 2006, and which is a continuation-in-part of U.S. patent application with Ser. No. 10/335,180, now U.S. Pat. No. 7,480,885, filed on Dec. 31, 2002, which claims priority to U.S. provisional application with Ser. No. 60/427,131, filed on Nov. 18, 2002. This application is also cross-related to U.S. non-provisional patent application Ser. No. 12/326,100, which was filed on Dec. 1, 2008 and is a divisional application of the aforementioned U.S. non-provisional patent application Ser. No. 10/335,180. This application is further cross related to U.S. non-provisional patent application with application Ser. No. 12/611,581, filed concurrently with this application. The contents of all the above non-provisional and provisional applications are hereby incorporated by reference in its entirety as if fully set forth herein.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Design engineers design IC's by transforming logical or circuit descriptions of the IC's into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. One EDA tool is a router that defines routes for interconnect lines that connect the pins of nets. Routing is generally divided into two phases: global routing and detailed routing. For each net, global routing generates a "loose" route for the interconnect lines that are to connect the pins of the net. The "looseness" of a global route depends on the particular global router used. After global routes have been created, the detailed routing creates specific individual routes for each net.

While some commercial global routers today might allow an occasional diagonal jog, these routers do not typically explore diagonal routing directions consistently when they are specifying the routing geometries of the interconnect lines. This lack of diagonal exploration increases the total wirelength (i.e., total length of interconnect lines) needed to connect the nets in the layout. Therefore, there is a need for a routing method and apparatus that considers diagonal routing directions. There is also a need for a new way of identifying and costing routes.

SUMMARY OF THE INVENTION

Some embodiments of the invention are methods and systems for implementing techniques for routing, modeling routes, and measuring congestion. In some embodiments, Gcells are implemented with reduced number of nodes to facilitate route modeling and congestion measurement. Some embodiments are particularly suitable for direct congestion and routing analysis of diagonal routing paths.

DETAILED DESCRIPTION

Figure 1:
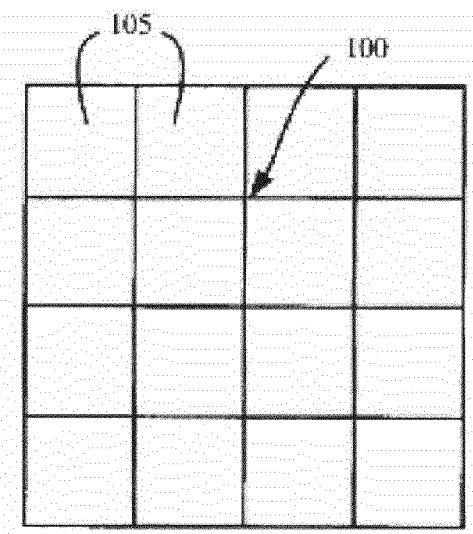
FIG. 1 illustrates a 4×4 section of a congestion grid.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention are methods and systems for implementing techniques for routing, modeling routes, and measuring congestion. In some embodiments, Gcells are implemented with fewer nodes to facilitate route modeling and congestion measurement.

Several embodiments of the invention provide a router that routes a set of nets in a region of an integrated circuit ("IC") layout. Each routed net includes a set of routable elements in the IC-layout region. The routable elements are pins in the embodiments described below, although they might be other elements in other embodiments.

Embodiment Using Four Nodes Per GCell

In the embodiments described in this section, the router uses a five-layer wiring model that has horizontal wiring on wiring layer 1, vertical wiring on wiring layer 2, horizontal wiring on wiring layer 3, +45 degree diagonal wiring on wiring layer 4, and −45 degree (also sometimes referred to as 135 degree) diagonal wiring on wiring layer 5. One of ordinary skill will realize that the router can use other wiring models in other embodiments. In some embodiments, a line is "diagonal" if it forms an angle other than 0 degree or 90 degree with respect to the layout's Cartesian coordinate axes, which are typically parallel with the layout's boundary and/or the boundary of the layout's expected IC. On the other hand, an interconnect line is "horizontal" or "vertical" if it forms an angle of 0 degree or 90 degree with respect to one of the coordinate axes of the layout. In certain circumstances, special transition moves must be employed with respect to the diagonal wiring layers. For example, a "zig" is a special move gadget used to model transitions between the disjoint quadrant sets of diagonal 135 and diagonal 45 degree layers, e.g., as described in co-pending U.S. application Ser. No. 10/335,180 and U.S. Pat. Nos. 7,171,635 and 7,047,513, all of which are hereby incorporated by reference in their entirety. As described in more detail in other sections below, some embodiments of the invention provide advantageous modeling approaches for routing that eliminate the requirement to use the zig transition.

In the embodiments described in this section, the router partitions an IC-layout region into several square sub-regions. For each net being routed, the router then identifies a global route that connects the set of sub-regions that contain at least one pin of the net. Each net's global route is a set of edges (i.e., interconnect lines) that connects the set of sub-regions that contain the net's pins. The identified routes might have horizontal, vertical, and +/−45 degree diagonal edges in the embodiments described below.

In these embodiments, the edges that are used to define each route are part of a routing graph used by the router. In some embodiments, the router uses two grids to create a routing graph. The first grid is a coarser grid that divides the IC layout into a number of sub-regions, called Gcells. The second grid is a finer grid that divides each Gcell into four sub-regions. In the embodiments described below, the Gcells are square. This shape well supports +/−45 degree routing, as any set of +/−45 degree wiring tracks that cut through a square Gcell will fill its horizontal and vertical boundaries consistently. One of ordinary skill will realize that other embodiments might use different shaped Gcells.

On each wiring layer, each of the four sub-regions in each Gcell is represented by a node at the center of the sub-region. The embodiments described below use the coarser grid to measure route congestion in the layout region, and use the finer grid to measure route lengths. Accordingly, below, the coarser grid is referred to as the congestion grid, while the finer grid is referred to as the length grid.

Figure 2:
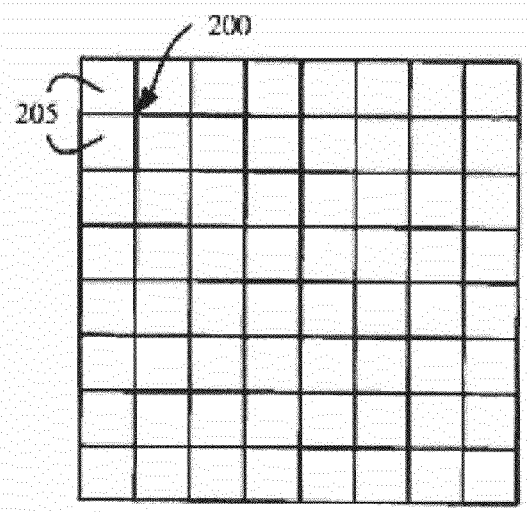
FIG. 2 illustrates a section of a length grid that divides each Gcell created by the congestion grid into four nodes.

FIGS. 1 and 2 illustrate small sections of the congestion and length grids. As shown in these figures, intersecting horizontal and vertical lines form both these grids. FIG. 1 illustrates a 4×4 section of the congestion grid 100. This section divides a portion of an IC region into 16 Gcells 105. In the embodiments described below, the congestion grid divides the IC region into many more Gcells (e.g., tens or hundreds of thousands).

Figure 3:
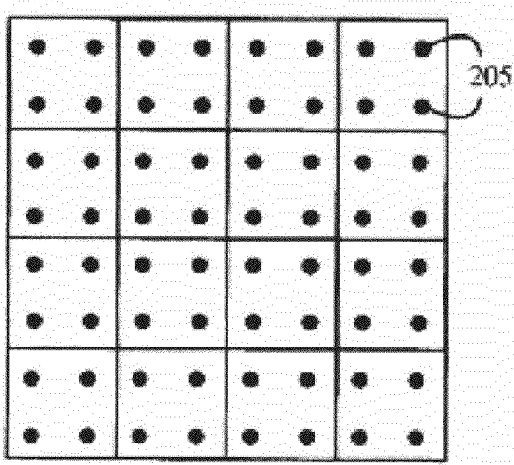
FIG. 3 illustrates the four nodes in each Gcell on a particular layer.

FIG. 2 illustrates a section of the length grid 200 that corresponds to the section of the congestion grid 100 illustrated in FIG. 1. As shown in this figure, the length grid divides each Gcell 105 into four nodes 205 on each wiring layer. FIG. 3 illustrates the four nodes in each Gcell on a particular layer. There are a number of planar and non-planar edges between the nodes defined by the length grid 200. These edges are referred to as "node edges" in the discussion below.

A planar node edge connects two adjacent routing-graph nodes. Each such edge represents a set of wiring tracks along the edge's particular direction that connect the two sub-regions represented by the edge's two nodes. Planar node edges have different directions on different wiring layers. FIGS. 4 through 7 illustrate the directions of these edges on layers 2-5 in some embodiments. Some embodiments assume that there are no planar node edges between routing-graph nodes on layer 1, as this layer is often quite congested. Some of these embodiments promote all the pins on layer 1 to layer 2. Other embodiments, however, specify planar node edges on layer 1. In some of these embodiments, the planar node edges on layer 1 are in the same direction as node edges on layer 3.

Figure 4:
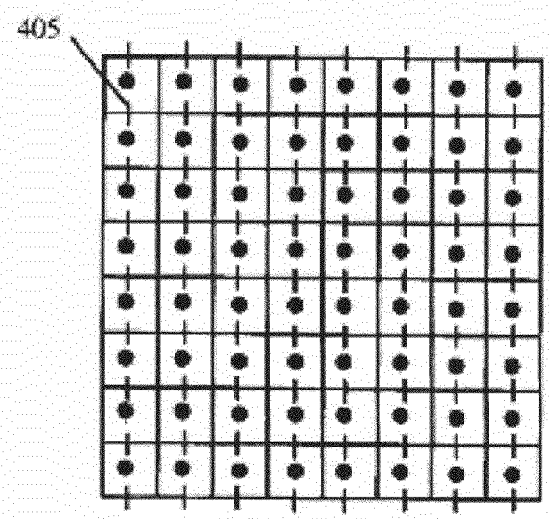
FIGS. 4-7 illustrate the directions of edges on interconnect layers 2-5 in some embodiments of the invention.
Figure 5:
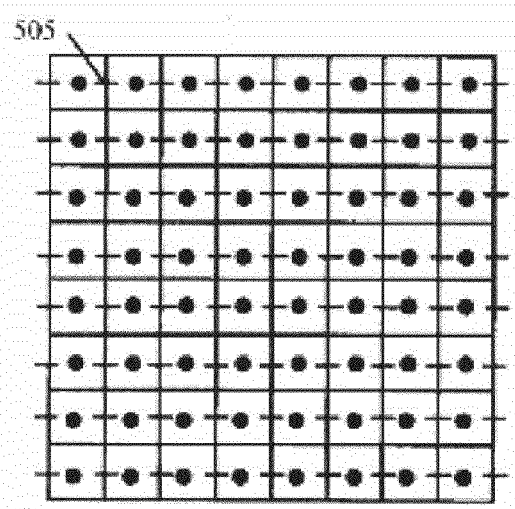
Figure 6:
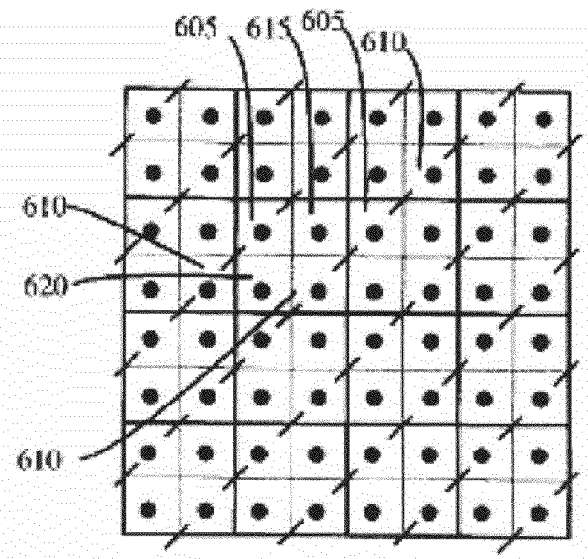
Figure 7:
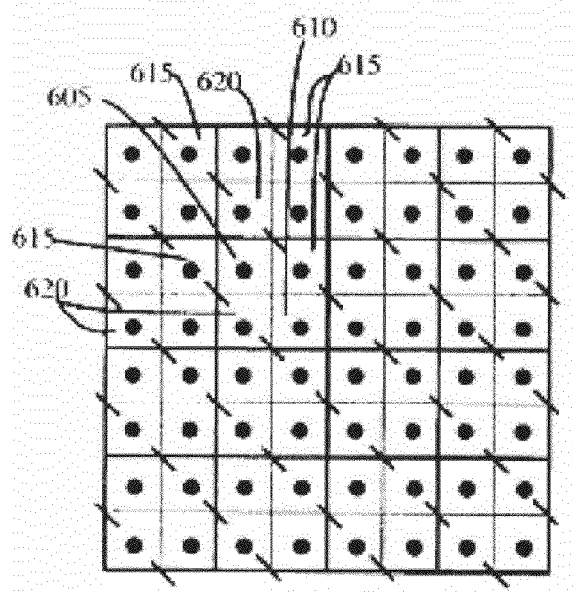

FIG. 4 illustrates that on layer 2 a vertical node edge 405 exists between each pair of vertically adjacent nodes, while FIG. 5 illustrates that on layer 3 a horizontal node edge 505 exists between each pair of horizontally adjacent nodes. FIGS. 6 and 7 illustrate that on layers 4 and 5, +/−45 degree diagonal node edges exist only between certain pairs of diagonally adjacent nodes. Specifically, FIG. 6 illustrates that 45 degree diagonal node edges exist between northwest nodes 605 and southeast nodes 610 of different Gcells. As shown in this figure, no 45 degree diagonal node edges are incident on northeast nodes 615 and southwest nodes 620. FIG. 7 illustrates that −45 degree diagonal node edges exist between northeast node 615 and southwest nodes 620 of different Gcells. As shown in this figure, no −45 degree diagonal node edges are incident on northwest nodes 605 and southeast nodes 610.

In the embodiments described below, each Manhattan node edge on layer 2 or 3 has a unit length cost (L). In these embodiments, each diagonal node edge on layer 4 or 5 has a length cost that equals the unit length cost times the square root of two (L*{square root} {square root over (2)}). Also, the use of a node edge across a Gcell boundary reduces the capacity of the boundary, and is thereby assessed a wire congestion cost.

The router examines wire congestion at Gcell boundaries on each layer available for routing. Specifically, on each available-routing layer, the router computes capacities at Gcell boundaries for wiring along the particular layer's direction. On a particular layer, the wiring resources (i.e., wiring tracks) across a Gcell boundary can be conceptually represented as a planar "congestion edge" across that boundary on the particular layer in the layer's wiring direction.

Figure 8:
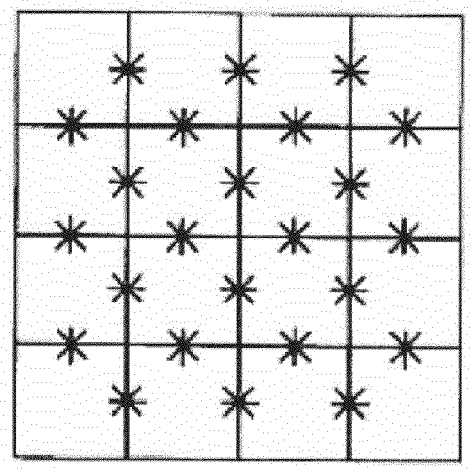
FIG. 8 illustrates edges that cross the Gcells created by the congestion grid.

FIG. 8 presents a two-dimensional diagram that illustrates the congestion edges on layers 2-5 for the routing directions illustrated in FIGS. 4-7. FIG. 8 illustrates one horizontal congestion edge across each vertical boundary between horizontally adjacent Gcells, one vertical congestion edge across each horizontal boundary between vertically adjacent Gcells, and one each 45 degree and −45 degree diagonal congestion edges across each boundary between each pair of adjacent Gcells. In this example, each vertical congestion edge is on layer 2, each horizontal congestion edge is on layer 3, each 45 degree congestion edge is on layer 4, and each −45 degree congestion edge is on layer 5.

The router keeps track of one congestion-grid capacity on each layer at each boundary between adjacent Gcells. Accordingly, each congestion edge is associated with all node edges that cross the same Gcell boundary on the same layer as the congestion edge. As illustrated in FIGS. 4-7, certain planar node edges cross the Gcell boundaries. In the embodiments described below, certain non-planar edges between layers 4 and 5 cross Gcell boundaries.

In some embodiments that use the wiring model illustrated in FIGS. 4-7, the association between the congestion edges and the node edges is as follows. Each horizontal congestion edge on layer 3 is associated with the pair of horizontal node edges that cross the same Gcell boundary as the horizontal congestion edge on the layer 3. Each vertical congestion edge on layer 2 is associated with the pair of vertical node edges that cross the same Gcell boundary as the vertical congestion edge on layer 2.

Each 45 degree diagonal congestion edge on layer 4 is associated with a 45 degree diagonal node edge that crosses the same Gcell boundary as the 45 degree diagonal congestion edge on layer 4, and can be associated with two non-planar node edges between layers 4 and 5 that cross the same Gcell boundary as the 45 degree congestion edge. Each −45 degree diagonal congestion edge on layer 5 is associated with a −45 degree diagonal node edge that crosses the same Gcell boundary as the −45 degree diagonal congestion edge on layer 5, and can be associated with two non-planar node edges between layers 4 and 5 that cross the same Gcell boundary as the −45 degree congestion edge.

Node edges start and terminate on nodes. Congestion edges, on the other hand, do not have explicit start and end points in some embodiments. This is because unlike node edges that are used to define routes, congestion edges function only to evaluate usage versus capacity. The router's use of node and congestion edges is further described below.

In the embodiments described below, the router can define routes that use non-planar node edges. In these embodiments, non-planar node edges exist (1) between each pair of nodes that are overlapping and that are in two adjacent routing layers (e.g., are in layers 2 and 3), (2) between certain pairs of non-overlapping nodes that are within the same Gcell and that are on adjacent diagonal layers 4 and 5, and (3) between certain pairs of non-overlapping nodes that are within adjacent Gcells and that are on adjacent diagonal layers 4 and 5. Each non-planar node edge represents a via between the two layers traversed by the edge. A non-planar edge that is between non-overlapping nodes in layers 4 and 5 also represents wiring to and from the edge's via. Each of the non-planar edge types will now be described further The routing graph includes a non-planar node edge between each pair of overlapping nodes that are on two adjacent routing layers. Each such non-planar edge represents a via between the edge's two nodes. Each such edge is assessed a wirelength cost and a via congestion cost. The wirelength cost equals a via-scalar factor (X) times the unit length cost (L) (i.e., is assessed a wirelength cost X*L). The via-scalar factor is 1 in some embodiments, while it is greater or less than one in other embodiments. The use of any non-planar edge also incurs a via congestion cost that represents the potential difficulty in placing too many vias between the two layers traversed by the non-planar edge in the Gcell associated with the non-planar edge's via. For a non-planar edge between two overlapping nodes, the Gcell associated with the edge's vias is the Gcell containing the two nodes.

Improved Routing Representation, Modeling, and Congestion Analysis

Some embodiments of the invention provide an improved approach for representing routing search space and doing congestion analysis. These embodiments provide several improvements, including (a) speeding up the search for routing paths; (b) eliminating moves that do not charge for congestion, which may sometimes produce paths that miss real blockages; (c) eliminating zigs.

To accomplish these improvements according to some embodiments, Gcell tiles are implemented such that only certain limited places within the tiles are permitted to be used as nodes. This limitation upon node locations serves to eliminate excess steps between routing points, while still maintaining any needed crossing points between tiles.

Figure 9:
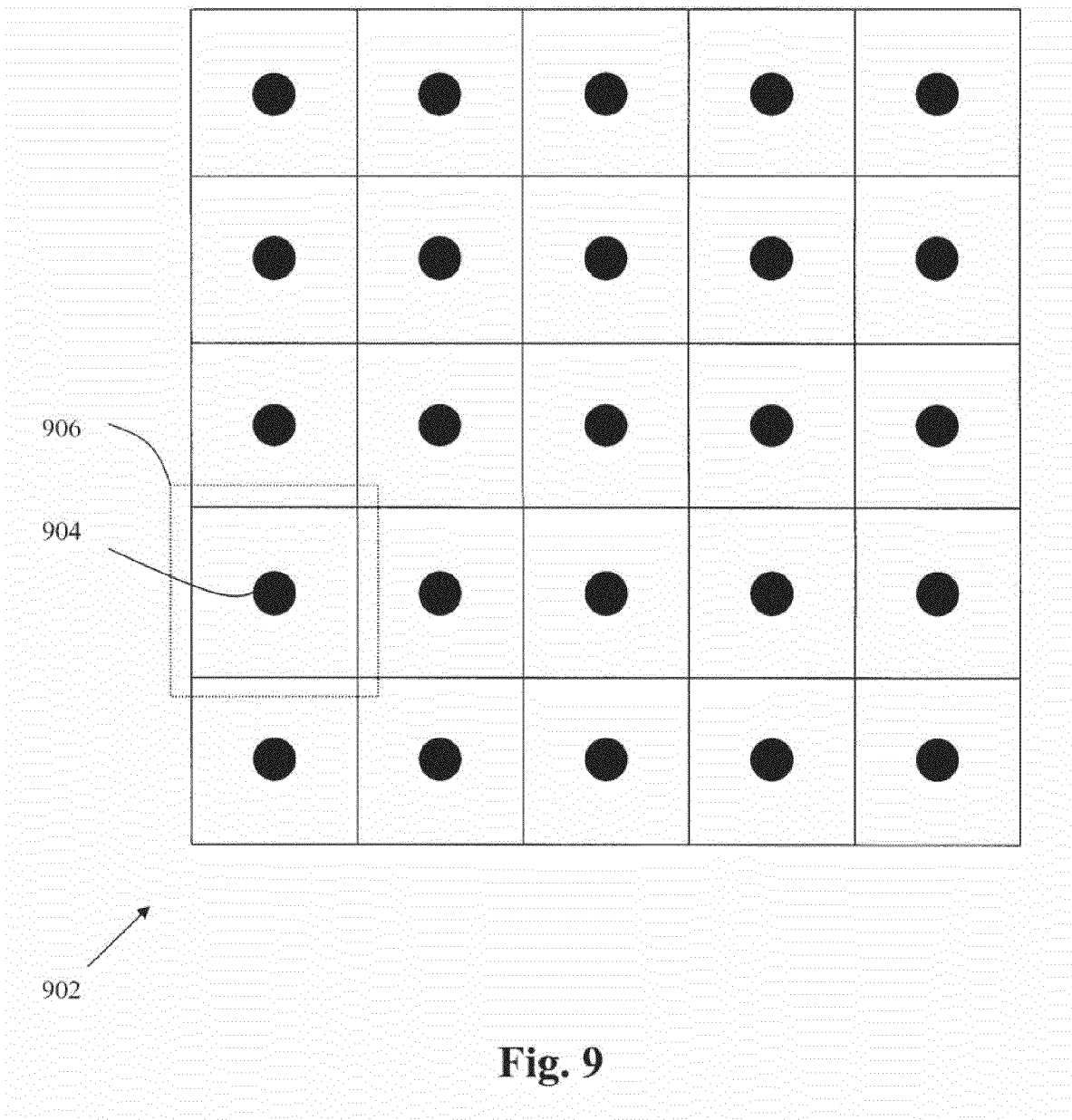
FIG. 9 illustrates a Gcell having a single node.

FIG. 9 shows an example of a Gcell grid 902 according to some embodiments, in which the routing model is represented as having one node 904 at the center of each Gcell 906. The idea is that the single node 904 provides a more direct connection from one Gcell to another Gcell, both within the same layer and across different layers of the design. A certain amount of distance resolution may be sacrificed, but this approach should also provide increased efficiencies and performance under many circumstances. In this approach, all connection points within the gcell 906, e.g., pins and terminals, are represented by the single node 904. This is true in some embodiments even if the pin is actually closer to another node, such as a corner node as described in more detail below. In an alternate embodiment, pins and terminals are represented by the nearest node, whether a center node or a corner node.

Figure 10:
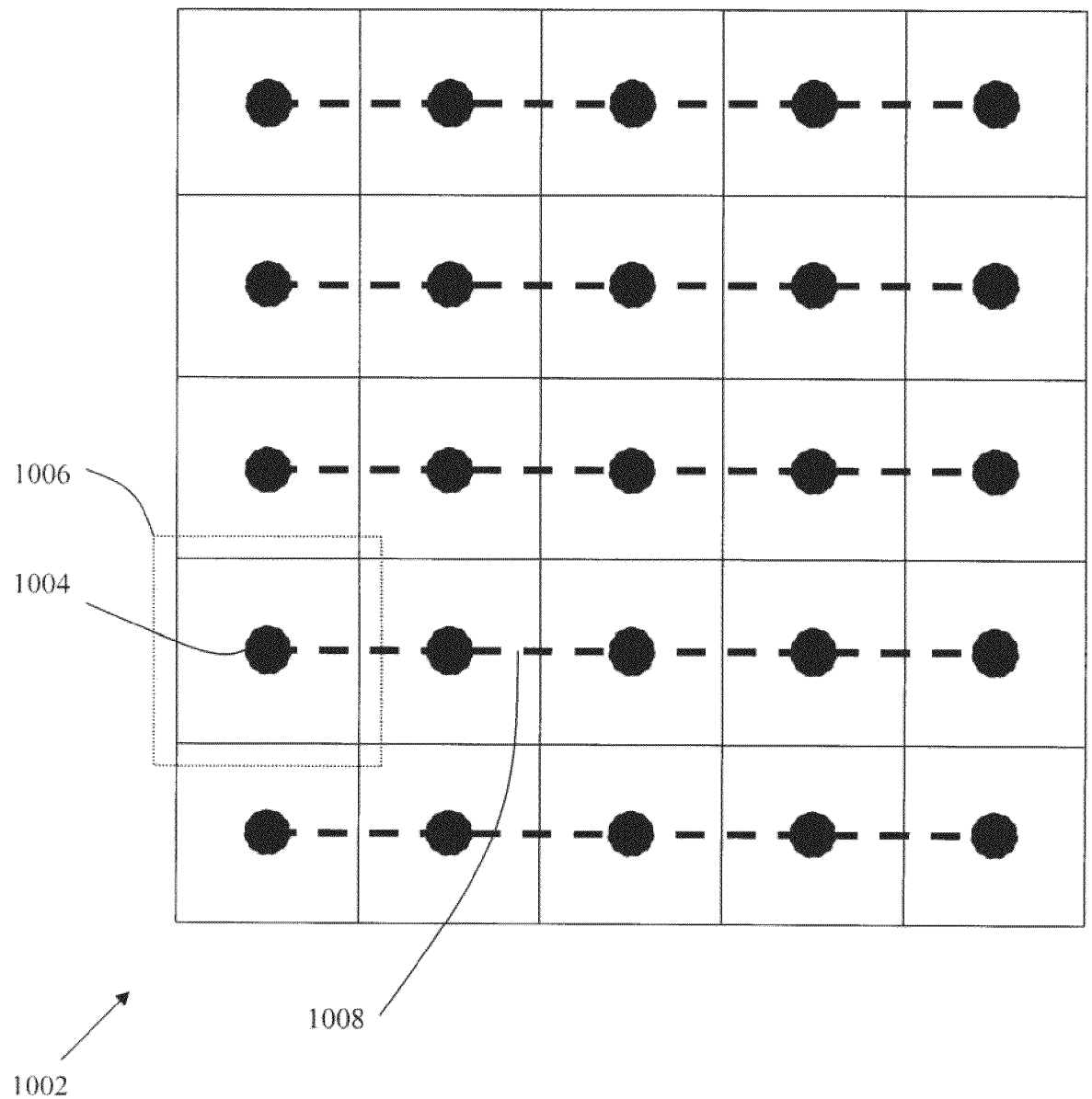
FIGS. 10-11 illustrate Gcells having single nodes for Manhattan wiring layers.

FIG. 10 illustrates an example Gcell grid 1002 for a horizontal Manhattan routing layer. This model includes one node 1004 at the center of each Gcell 1006. The routing paths 1008 are routed in a horizontal Manhattan direction from each node to its adjacent node.

Figure 11:
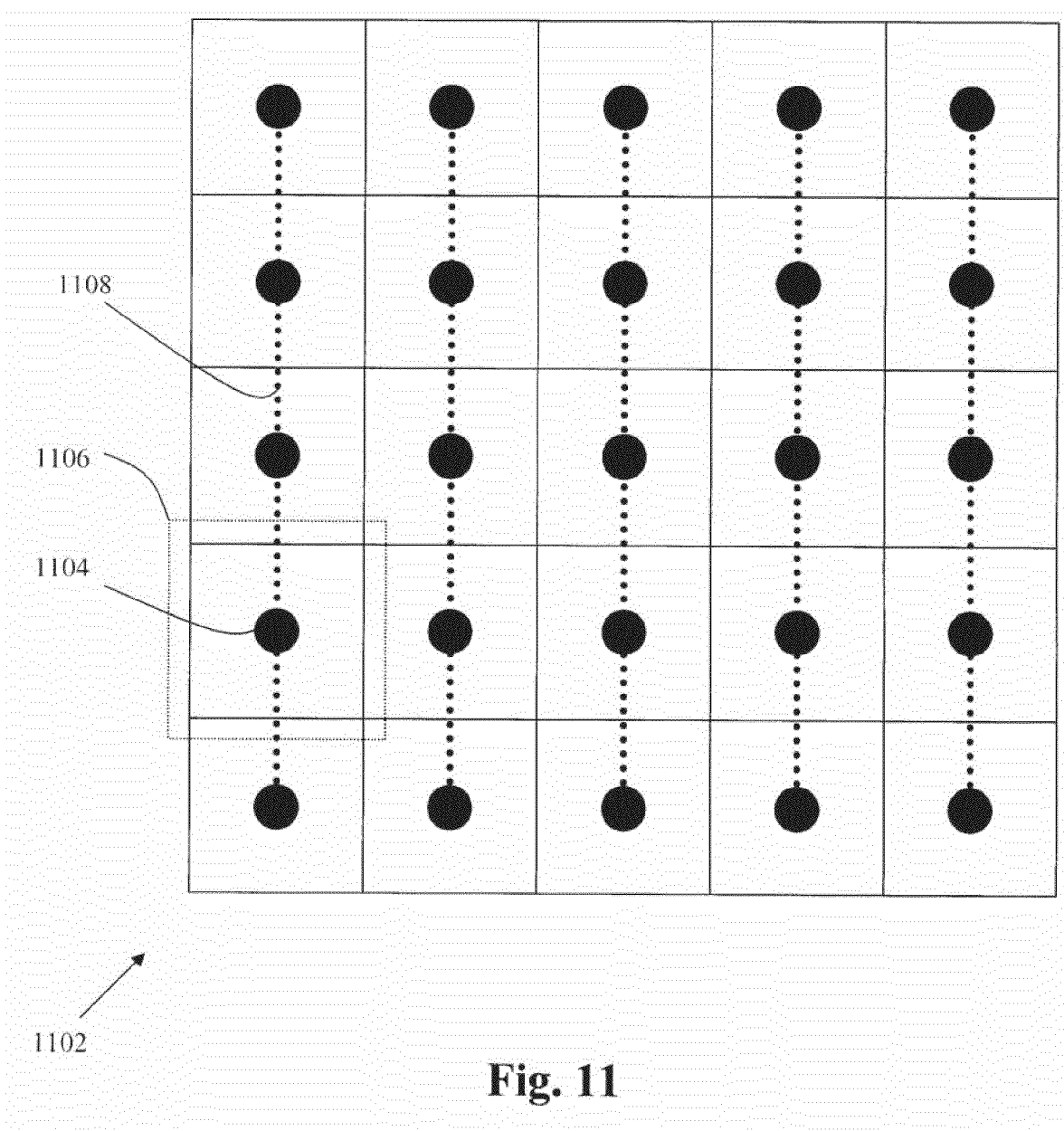

FIG. 11 illustrates an example Gcell grid 1102 for a vertical Manhattan routing layer. This model includes one node 1104 at the center of each Gcell 1106. The routing paths 1108 are routed in a vertical Manhattan direction from each node to its adjacent node.

Figure 12A:
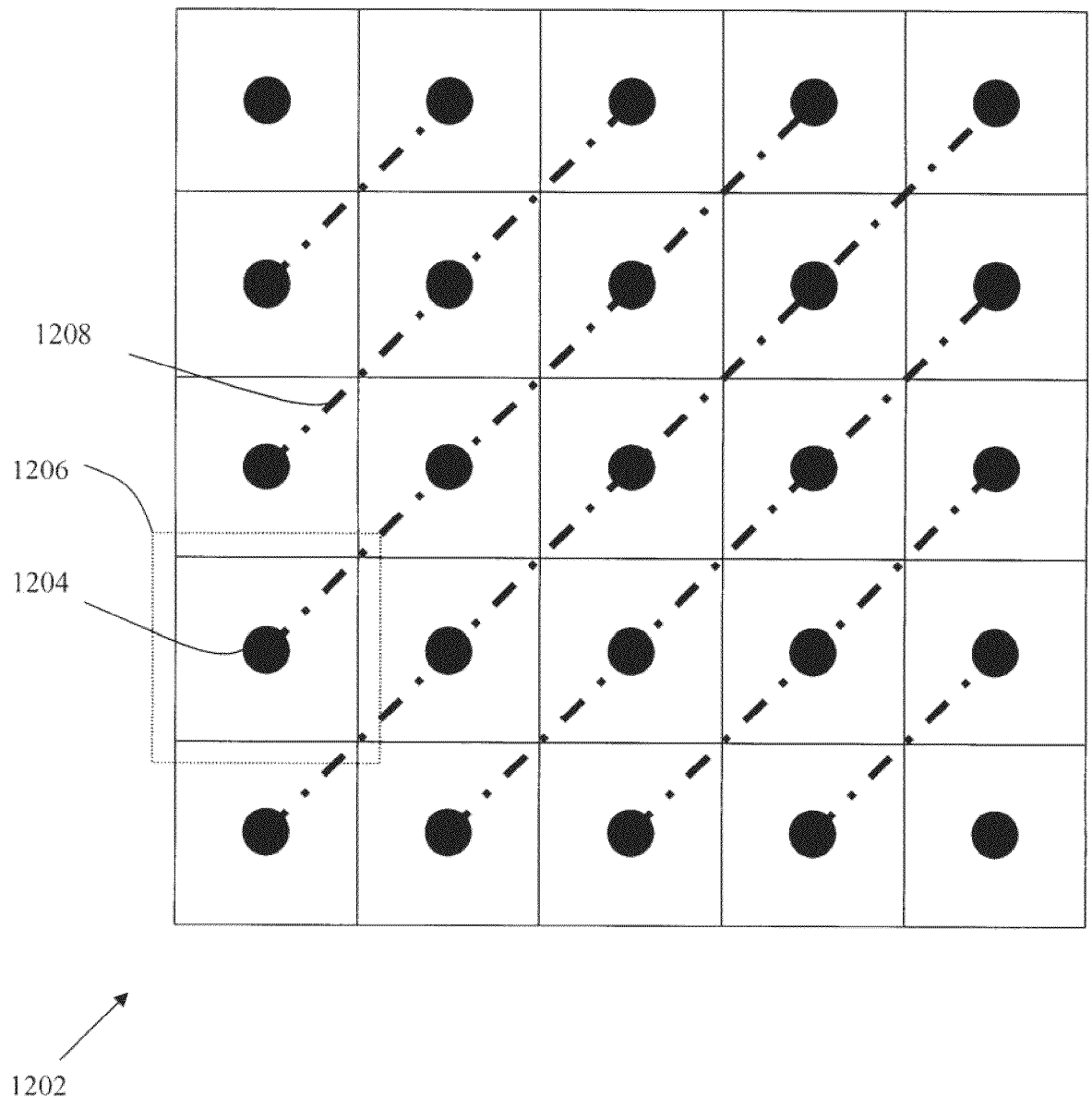
FIGS. 12A-C illustrate cells for a 45 degree wiring layer.

FIG. 12A illustrates an example Gcell grid 1202 for a 45 degree diagonal routing layer. This model includes one node 1204 at the center of each standard Gcell 1206. The 45 degree diagonal routing paths 1208 are routed each node to its diagonal adjacent node across the intersection point between Gcells.

Figure 12B:
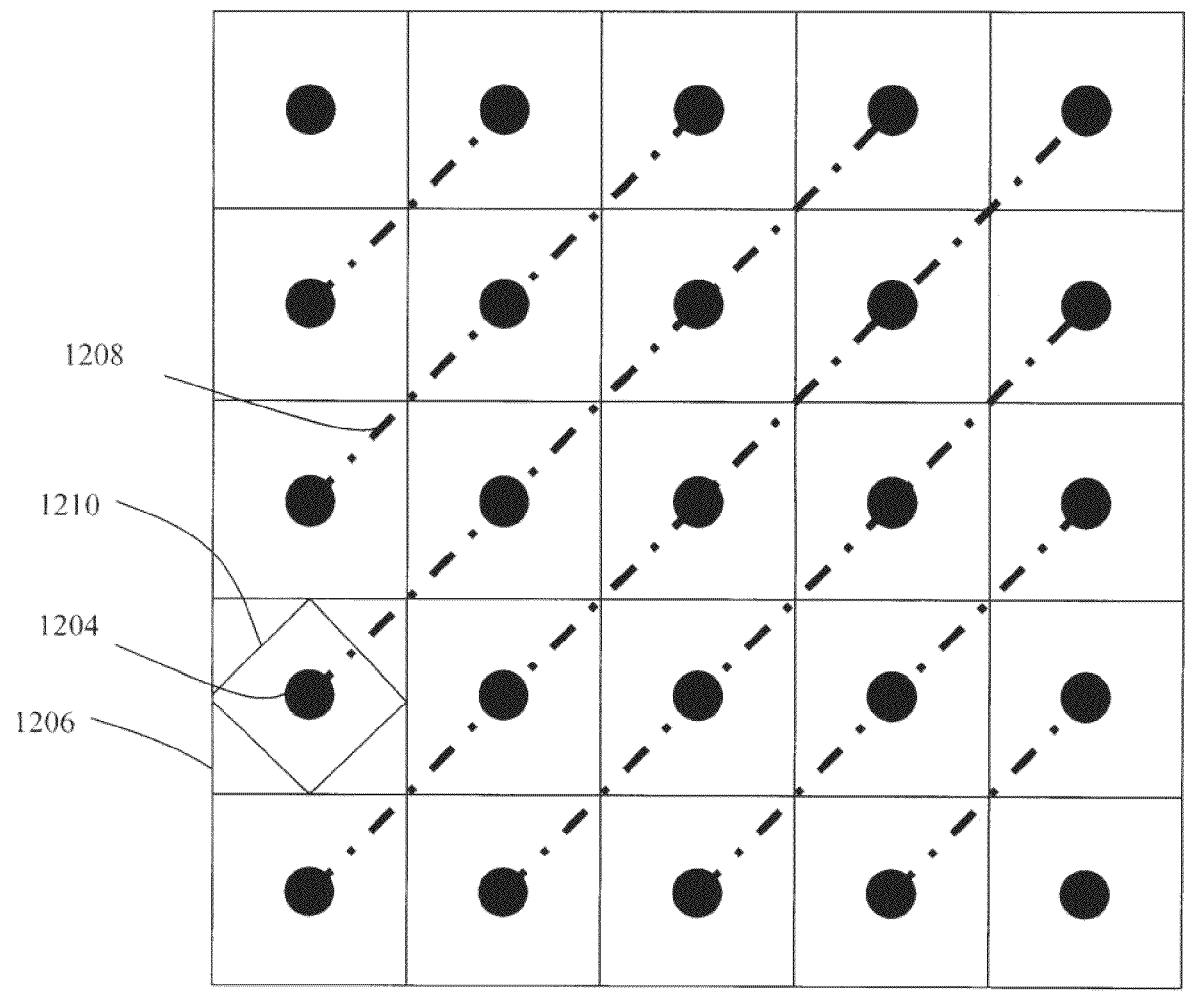

In some embodiments for the diagonal layers, instead of associating the center node 1204 with the entire Gcell, the node 1204 is identified with only a portion of one or more Gcells. This can be shown in FIG. 12B, in which a node 1204 is associated with inscribed diamond 1210 within Gcell 1206. The inscribed diamond is the shape that can be used for congestion analysis of diagonal layers, as described in more detail below. In the embodiment of FIG. 12B, the inscribed diamond 1210 covers half the area of a standard Gcell 1206.

In some embodiments, routing from one diagonal center node to its directly adjacent vertical or horizontal center node may need to utilize movement onto another layer. This is an example of a "chessboard" problem in which models that can only transition diagonally from one center node to another center node may not allow routing between adjacent center nodes, similar to the movement of bishops on a chessboard in which a bishop on a whites space can never move to an adjacent black space because the bishop only moves diagonally. For example, routing from a first center node on the 135 degree routing layer to a second center node in an adjacent Gcell could be accomplished by using a via to move from the first center node on the 135 degree routing layer to a first vertical center node on the vertical Manhattan routing layer. Thereafter, a vertical routing path is created to a second vertical center node on the vertical Manhattan routing layer, and then another via is used to move to the second center node on the 135 degree routing layer.

Figure 12C:
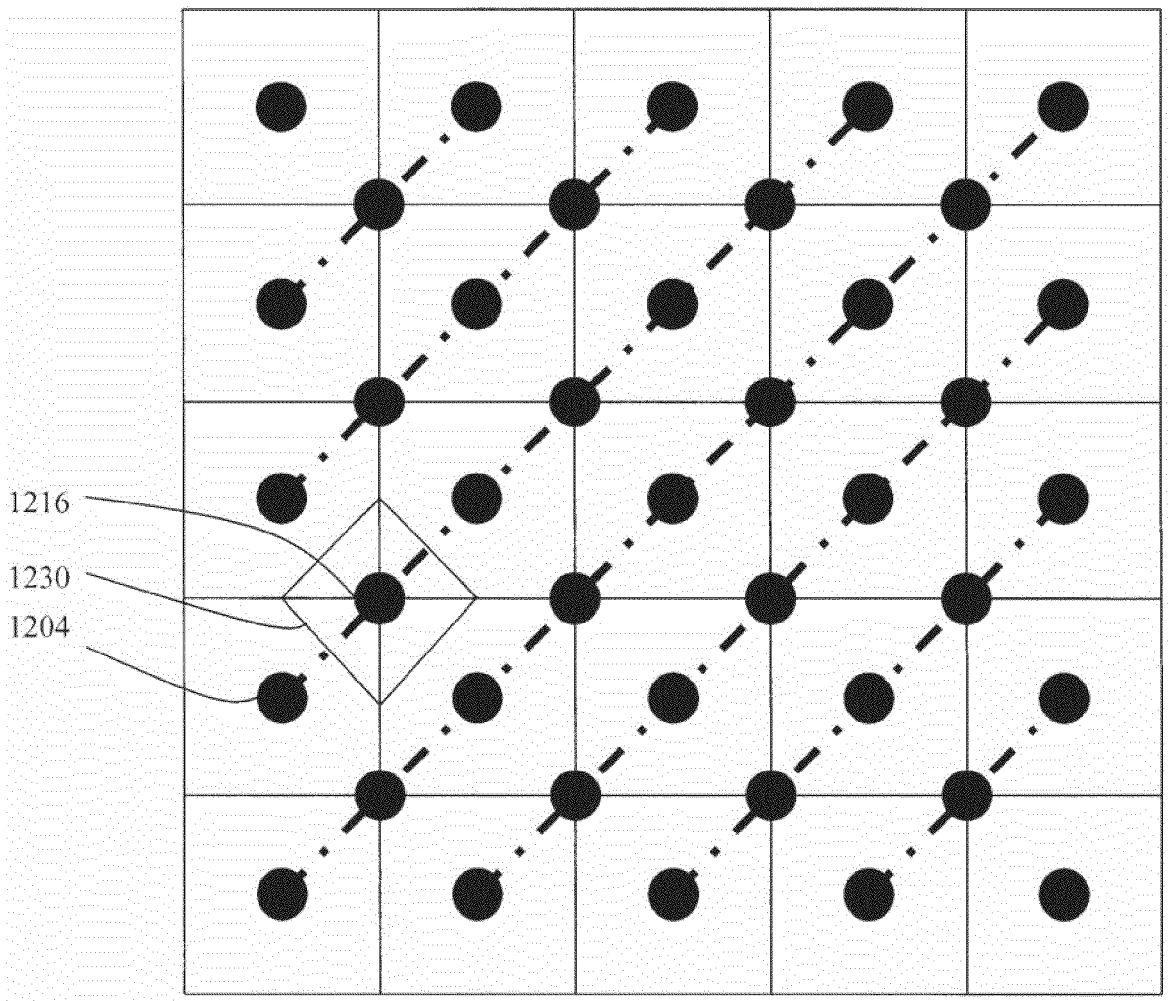

As shown in FIG. 12C, each diagonal move from the center node 1204 of a Gcell can be modeled to go through a corner node 1216, which is the intersection between four standard Gcells 1206 (or the intersection of fewer Gcells at the edge of the Gcell grid). The corner node 1216 provides enhanced distance resolution for diagonal routing directions. In addition, using corner nodes will avoid the problem described above of requiring transitions to Manhattan routing layers to route between adjacent center nodes, since the route between adjacent center nodes can be made by diagonally routing through a connecting corner node. The corner node 1216 can also be associated with a diamond shape 1230 of the same size as the inscribed diamond 1210 shown in FIG. 12B. This diamond shape 1230 fills out the space left by the "centered" diamonds. Continuing one more step in the same direction brings the route representation to the standard center node 1204 of the next Gcell. Therefore, in the approach shown in FIG. 12C, it takes two diagonal moves to travel from one Gcell to any that it touches at a corner.

Figure 13A:
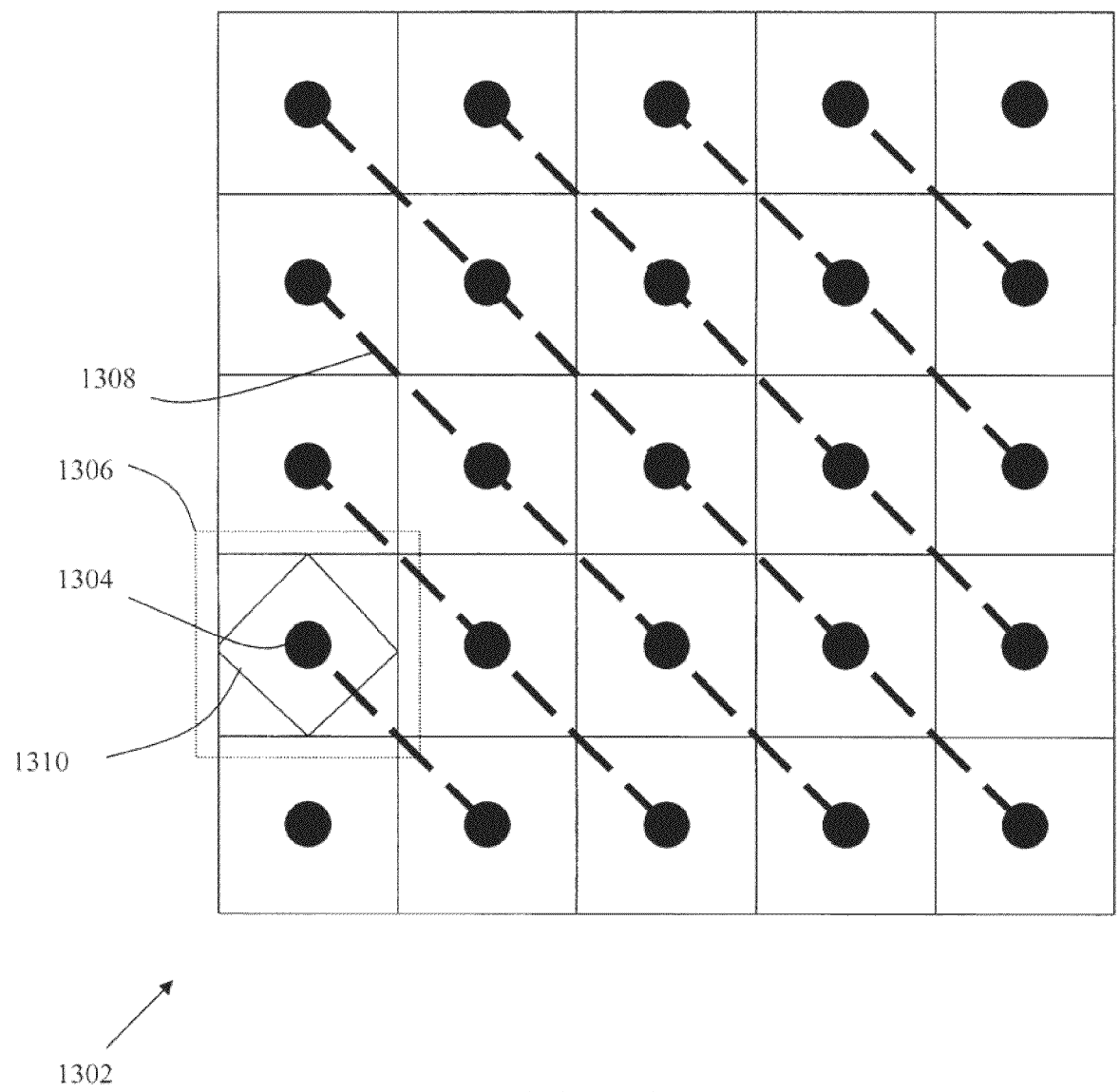
FIGS. 13A-B illustrate cells for a 135 degree wiring layer.

A similar approach can be taken to represent route modeling for the 135 degree diagonal direction layer. FIG. 13A illustrates an example Gcell grid 1302 for a 135 degree diagonal routing layer. This model includes one node 1304 at the center of each standard Gcell 1306. The 135 degree diagonal routing paths 1308 are routed from each node to its diagonal adjacent node across the intersection point between Gcells. Similar to the description of the 45 degree diagonal layer, the node 1304 can be identified with a different portion of one or more Gcells, such as the inscribed diamond 1310 in Gcell 1306. In the embodiment of FIG. 13A, the inscribed diamond 1310 covers half the area of a standard Gcell 1306.

Figure 13B:
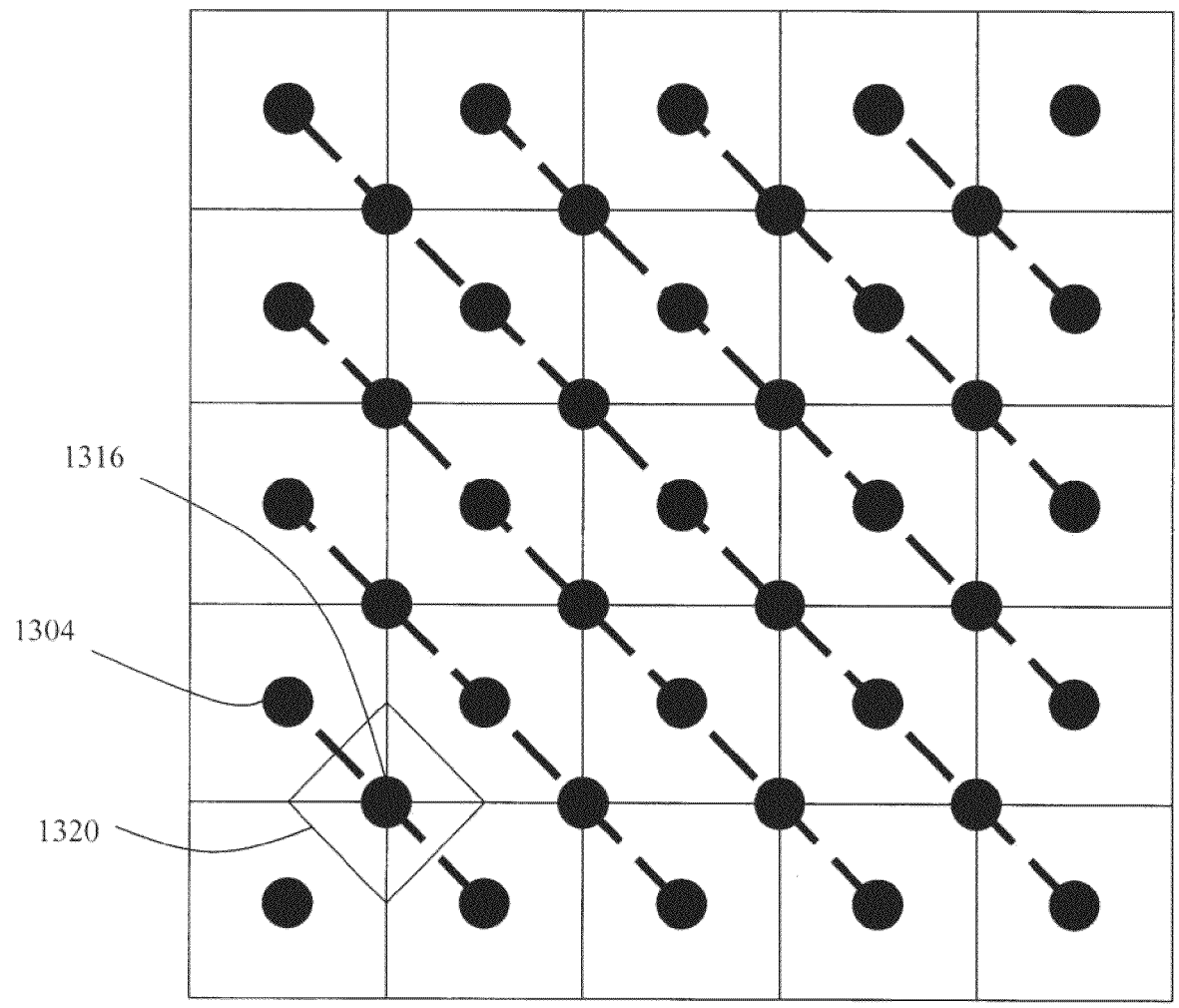

As shown in FIG. 13B, each diagonal move from the center node 1304 of a Gcell can be modeled to go through a corner node 1316, which is the intersection between standard Gcells 1306. The corner node 1316 provides enhanced distance resolution for diagonal routing directions. The corner node 1316 can also be associated with a diamond shape 1320 of the same size as the inscribed diamond 1310 shown in FIG. 13A. This diamond shape 1320 fills out the space left by the "centered" diamonds. Continuing one more step in the same direction brings the route representation to the standard center node 1304 of the next Gcell. Therefore, in the approach shown in FIG. 13B, it takes two diagonal moves to travel from one Gcell to any that it touches at a corner.

In this model, direct connections are available from the center node of each Gcell to two Manhattan neighbors in its layer's preferred direction. To illustrate, consider the configuration represented by FIG. 14. The transition from the diagonal route 1402 on the 135 degree diagonal routing layer to a vertical route 1404 on a vertical Manhattan routing layer happens at node 1406. Similarly, the transition from the diagonal route 1402 on the 135 degree diagonal routing layer can be made to a horizontal route 1408 on a Manhattan routing layer at node 1410. It is noted that these transitions can be made while avoiding zig movements.

Figure 14:
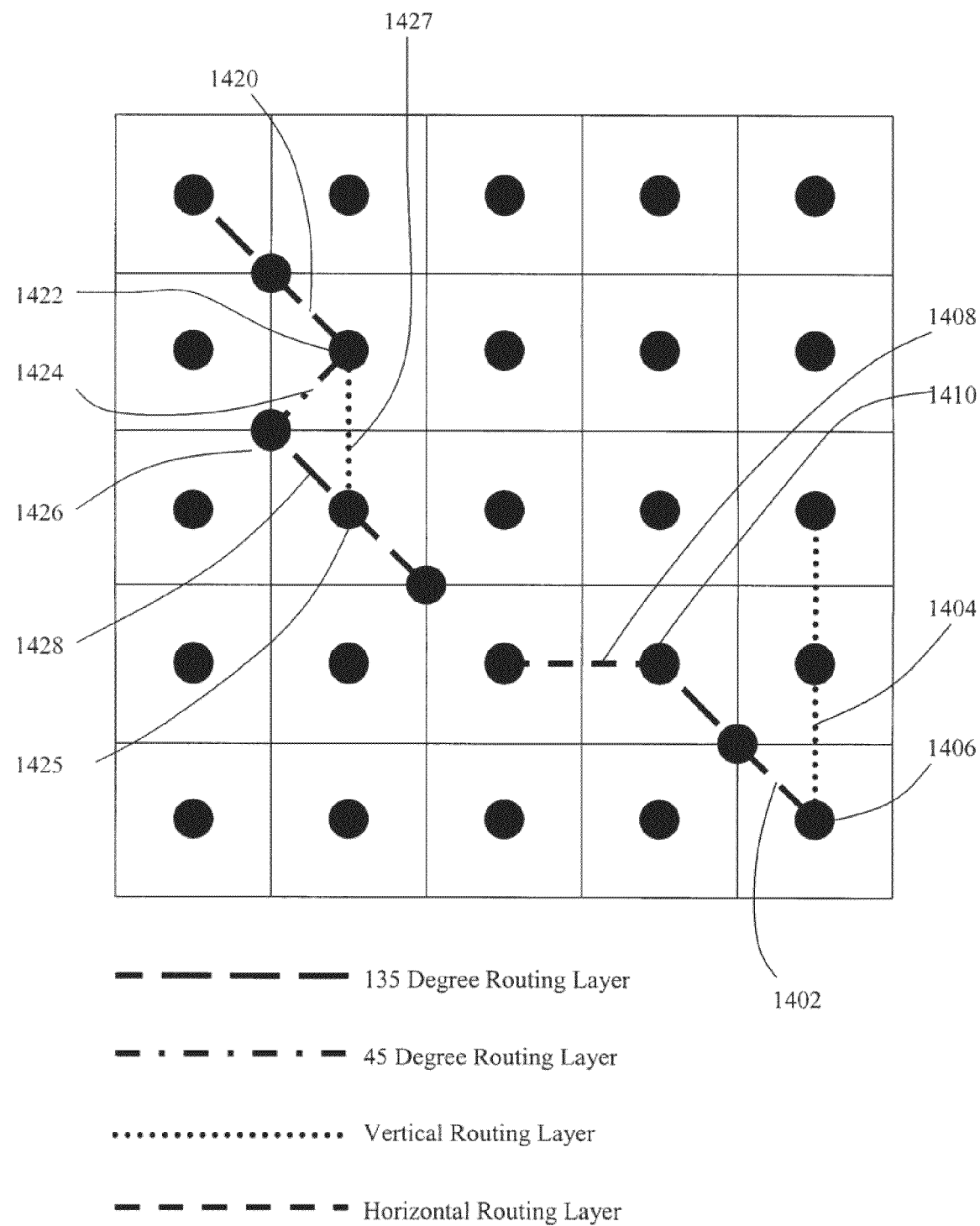
FIG. 14 illustrates transitions between layers using the present model.

Transitions between two diagonal layers can be made at any of the nodes, including corner nodes. To illustrate, shown in FIG. 14 is a diagonal route 1420 on the 135 degree diagonal routing layer. Diagonal route 1420 on the 135 degree diagonal routing layer transitions to diagonal route 1424 on the 45 degree diagonal routing layer through a center node 1422. In turn, diagonal route 1424 on the 45 degree diagonal routing layer transitions to diagonal route 1428 on the 135 degree diagonal routing layer through a corner node 1426. Corner nodes thus support transitions between diagonal 45 degree and diagonal 135 degree routing.

In some embodiments, via moves are available between aligned center nodes of any two adjacent layers. In some embodiment, the only vias allowed at the corner nodes are between diagonal layers.

Figure 15:
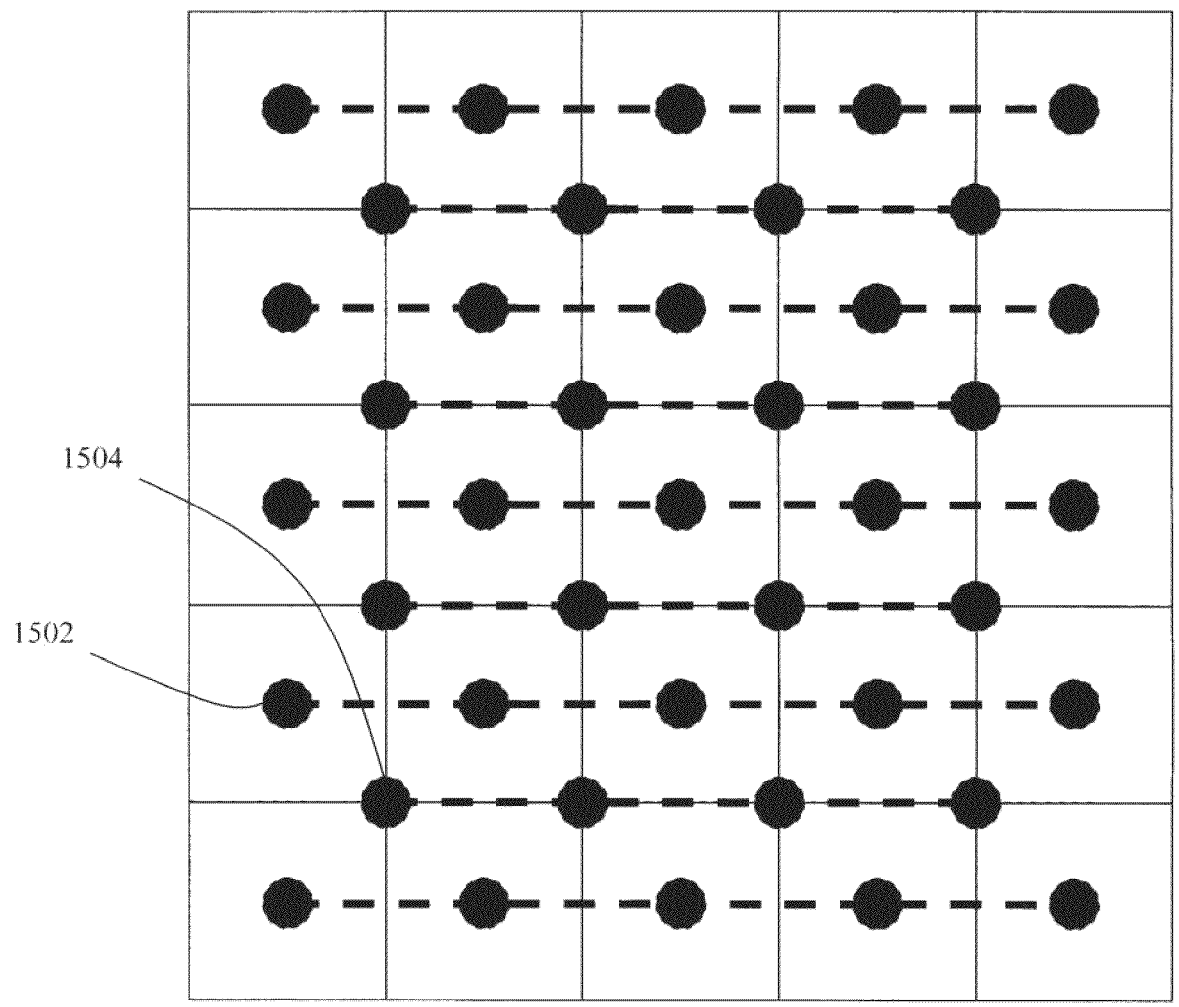
FIGS. 15-16 illustrate corner nodes for Manhattan wiring layers.
Figure 16:
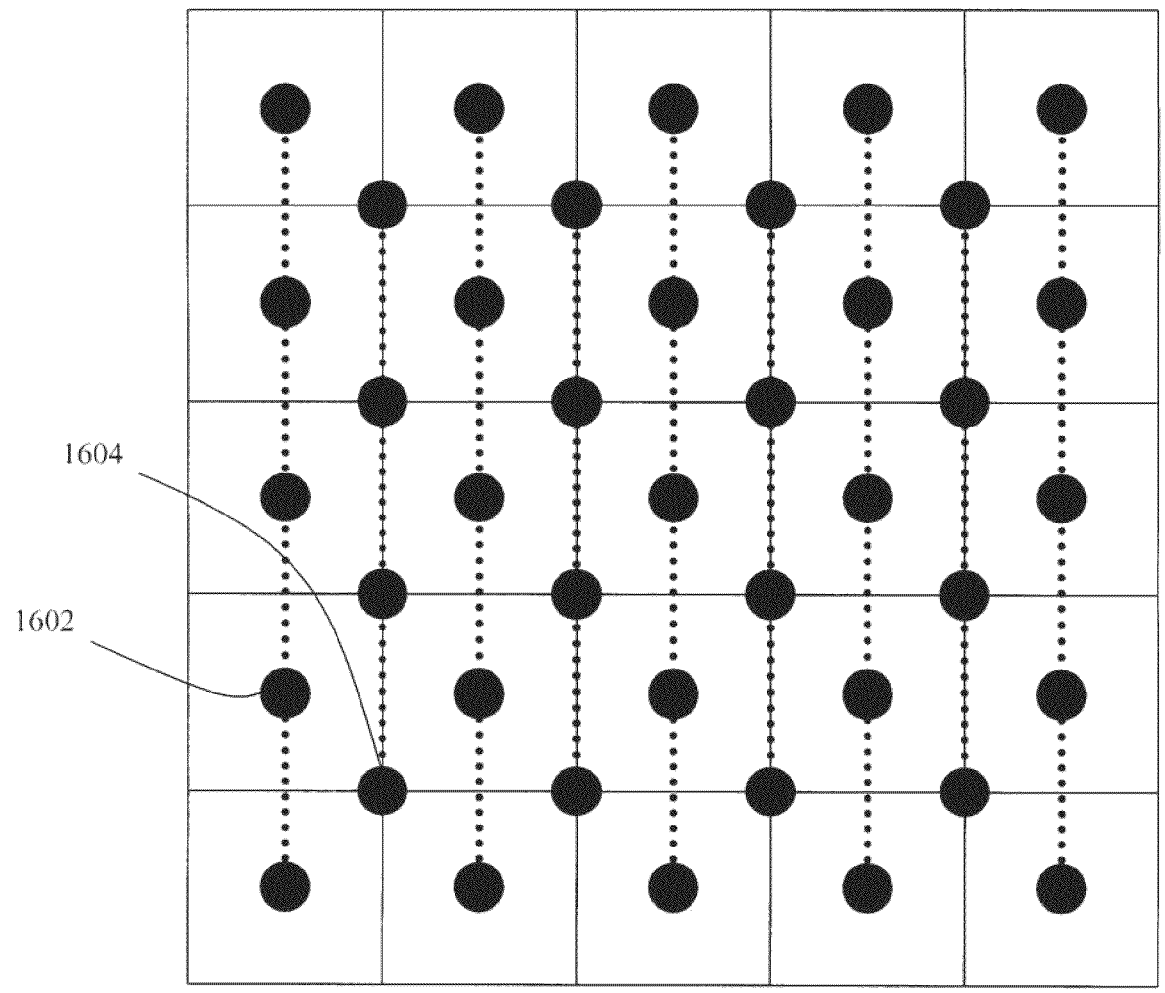

FIGS. 15 and 16 illustrate alternate embodiments in which corner nodes may also be employed on the Manhattan wiring layers. FIG. 15 shows a horizontal Manhattan layer in which both center nodes 1502 and corner nodes 1504 are usable for horizontal wiring routes. FIG. 16 shows a vertical Manhattan layer in which both center nodes 1602 and corner nodes 1604 are usable for vertical wiring routes. In these approaches, vias are allowed at the corner nodes for all layers, thereby allowing transitions in direction at any of the center or corner nodes.

Some embodiments of the invention are directed to approaches in which Gcells on different layers correspond to different shapes, dimensions, orientations, and/or sizes.

Figure 17A:
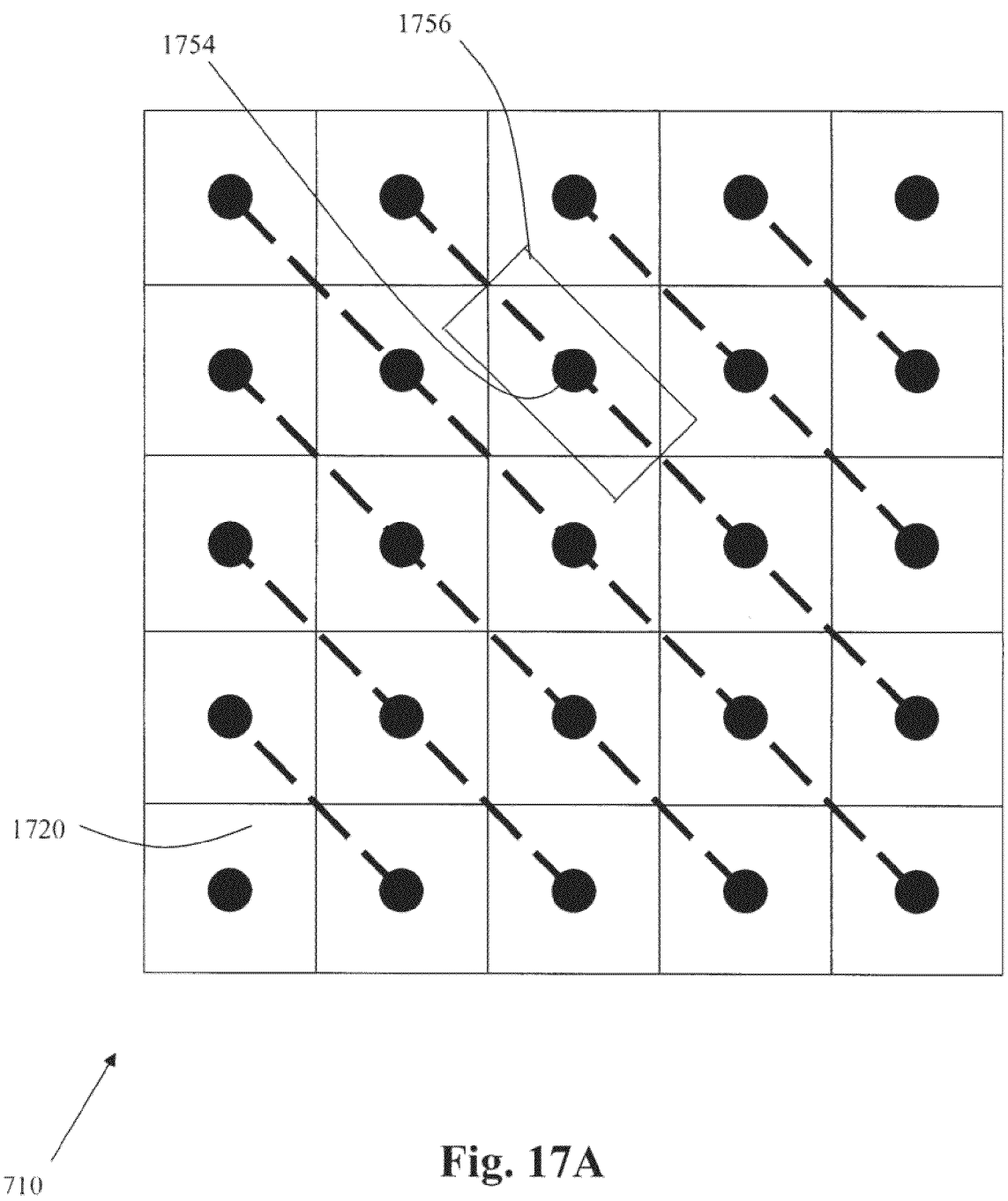
FIGS. 17A-F illustrate different Gcell shapes, sizes, dimensions, and/or orientations for different layers.

To illustrate, consider the Gcell grid 1710 shown in FIG. 17A. An array of square Gcells 1720 are shown in grid 1710. Assume that the square Gcells 1720 are used to facilitate Manhattan routing. Therefore, any vertical or horizontal Manhattan routing would be modeled with the square Gcells 1720 as described above.

However, the 135 degree routing layer corresponds to Gcells having different shapes than the square Gcell 1720. For example, shown in the figure is a Gcell 1756 corresponding to node 1754 that is shaped as an elongated rectangle which has a longer length along the preferred wiring direction. The 135 degree Gcell 1756 is oriented such that the rectangular shape is aligned to match the preferred direction of the routing layer.

Figure 17B:
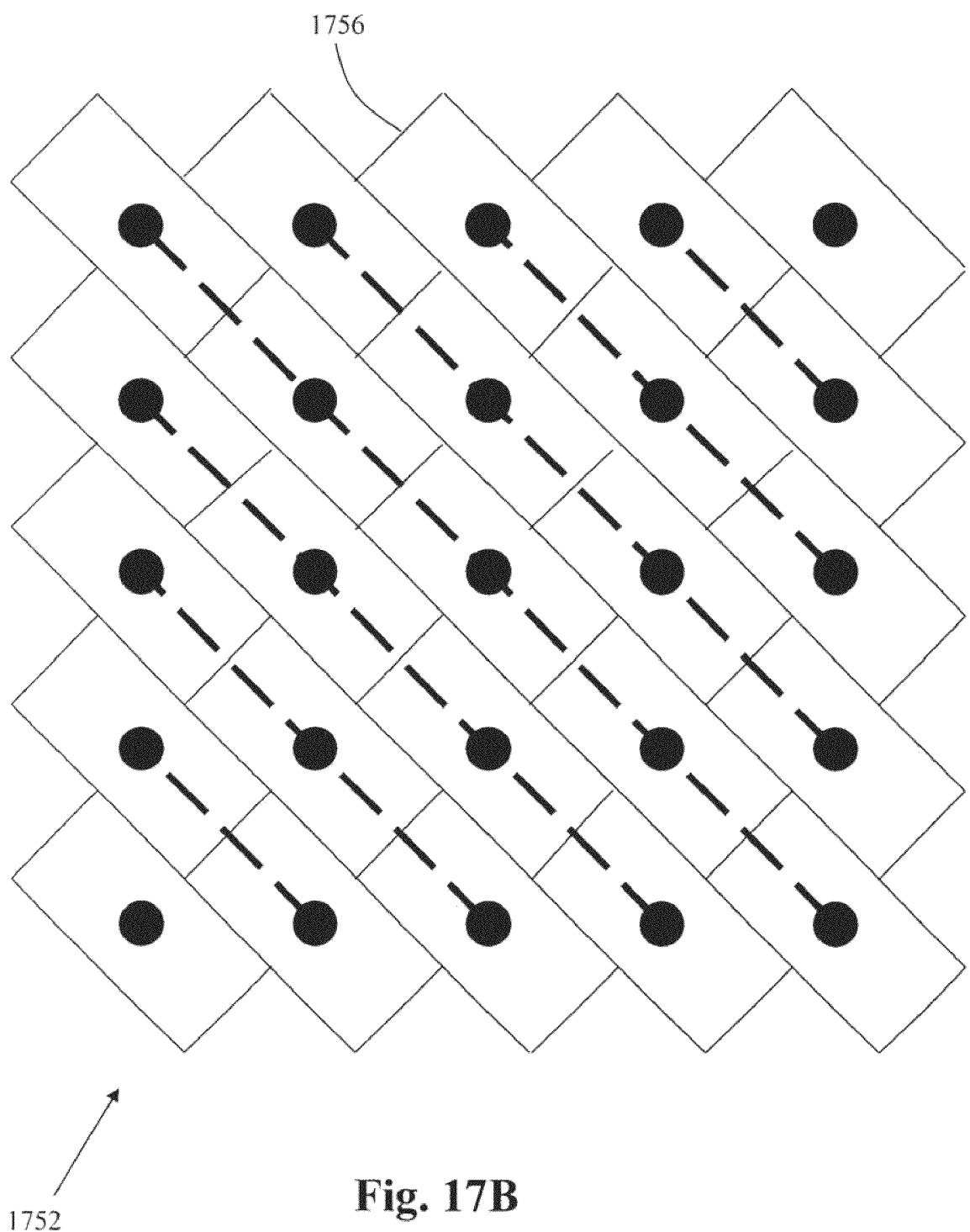

FIG. 17B shows an array 1752 of such 135 degree Gcells 1756 that would be modeled across the 135 degree routing layer, assuming that corner nodes are not being used. The Gcells 1756 in the lengthwise direction have boundaries that are equidistant between the nodes. Adjacent Gcells 1756 in the non-lengthwise directions are offset from one another.

Figure 17C:
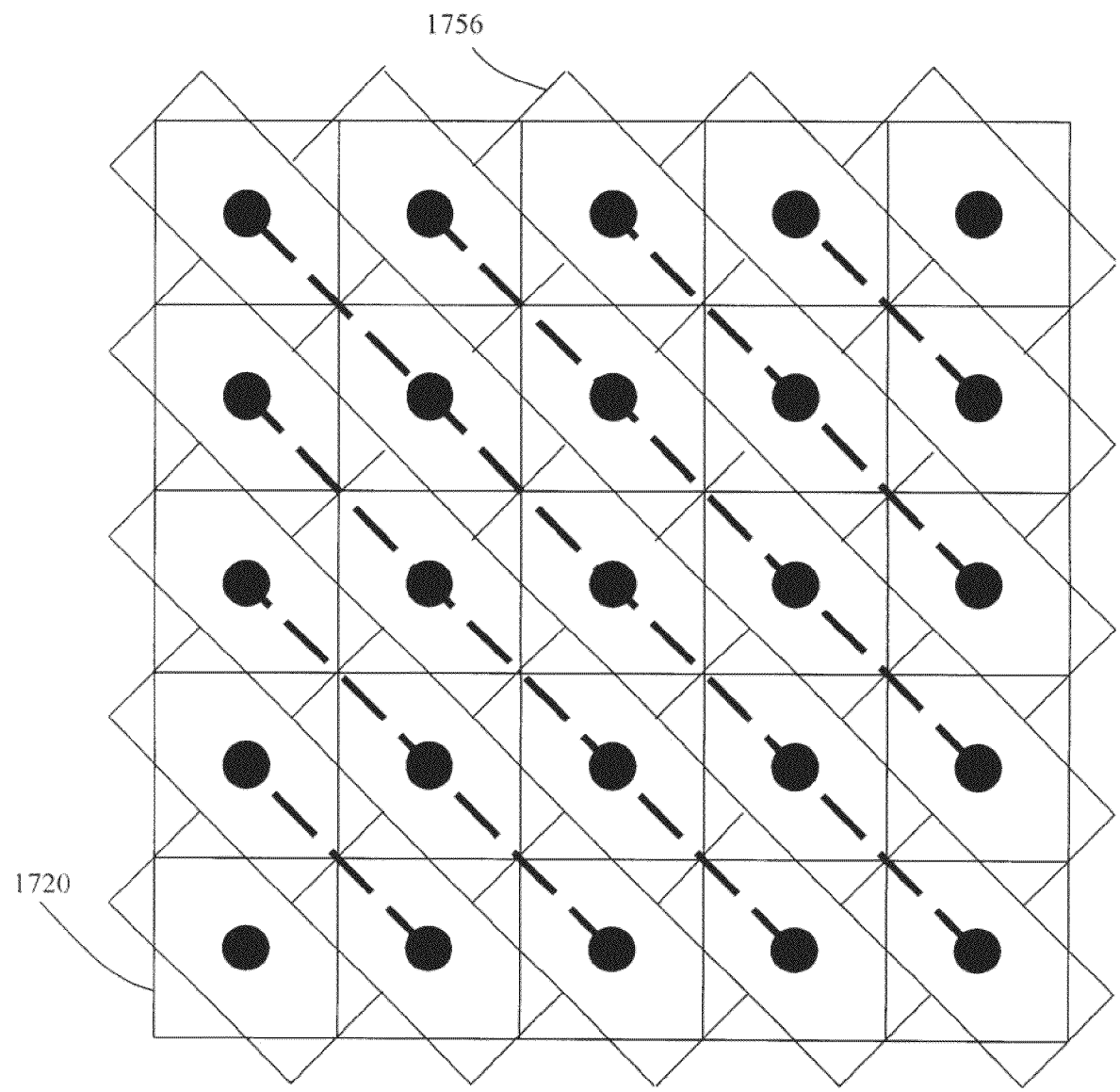

FIG. 17C shows a grid pattern of the 135 degree Gcells 1756 overlaid on a grid pattern of the Manhattan Gcells 1720. It can be seen that the 135 degree Gcells 1756 have different shapes and orientations as compared to the Manhattan Gcells 1720. However, both types of Gcells cover the same area. It is noted that in this embodiment, the 135 degree Gcells 1756 have boundaries in the lengthwise direction which correspond to the intersection points of the Manhattan Gcells 1720.

Figure 17D:
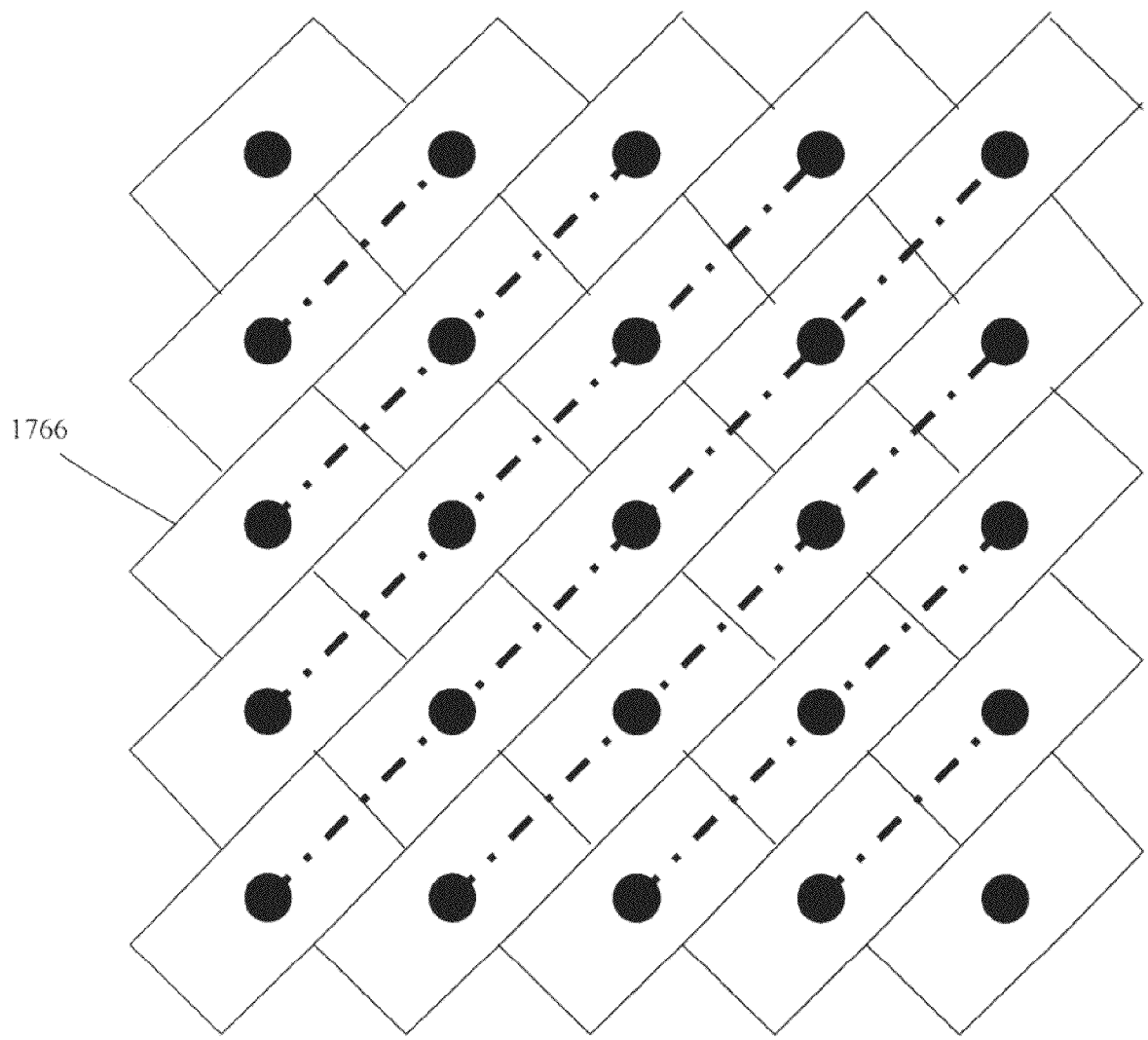

In a similar manner, the 45 degree routing layer corresponds to Gcells having different shapes than the square Gcell 1720. For example, FIG. 17D shows an array of 45 degree Gcells 1766 that are shaped as an elongated rectangle which has a longer length along the preferred wiring direction. The 45 degree Gcell 1766 is oriented such that the rectangular shape is aligned to match the preferred direction of the routing layer. This rectangular shape is used if the layer is not modeled with corner nodes. The Gcells 1766 in the lengthwise direction have boundaries that are equidistant between the nodes. Adjacent Gcells 1766 in the non-lengthwise directions are offset from one another.

Figure 17E:
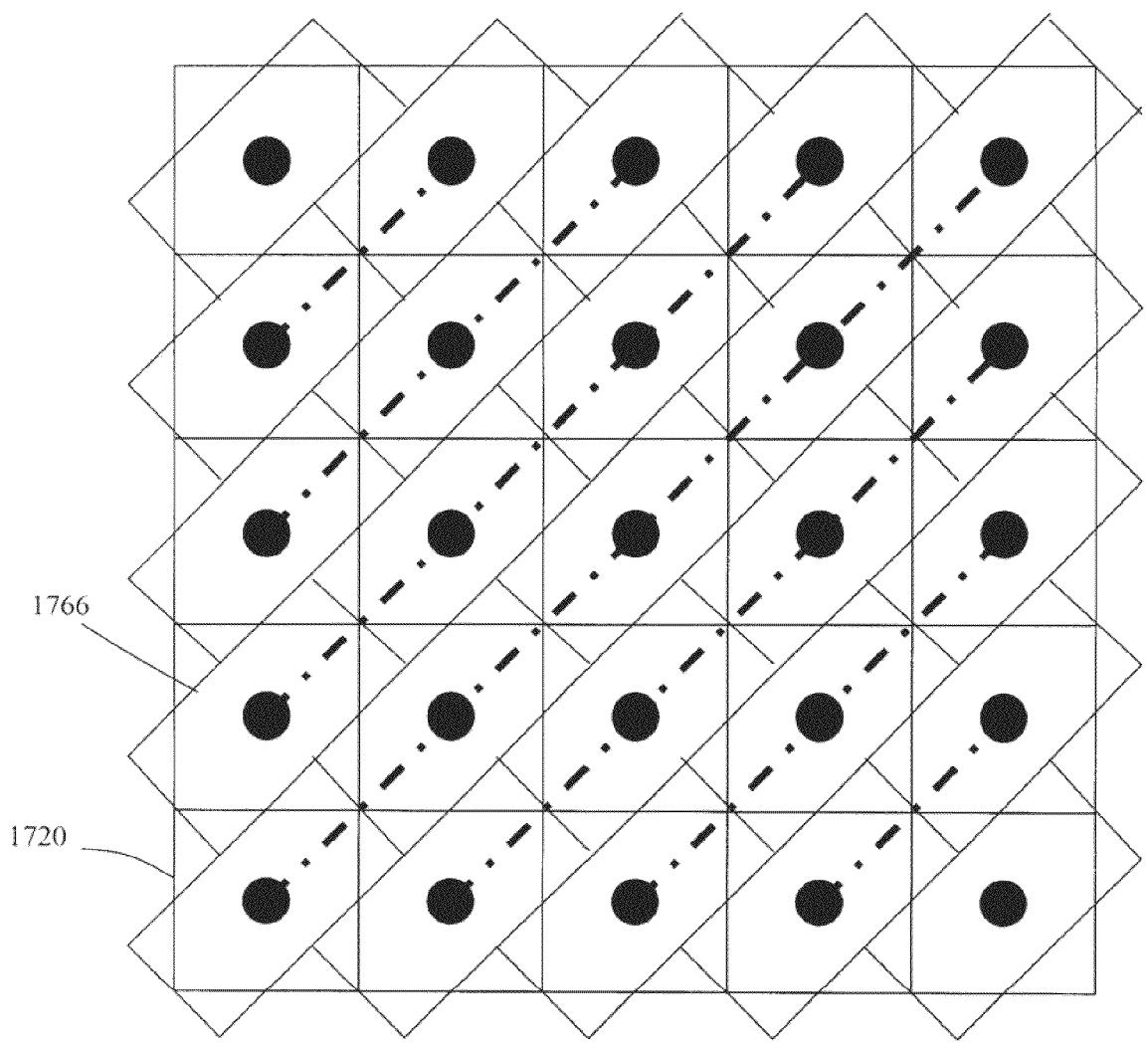

FIG. 17E shows a grid pattern of the 45 degree Gcells 1766 overlaid on a grid pattern of the Manhattan Gcells 1720. The 45 degree Gcells 1766 have different shapes and orientations as compared to the Manhattan Gcells 1720. However, both types of Gcells cover the same area.

Figure 17F:
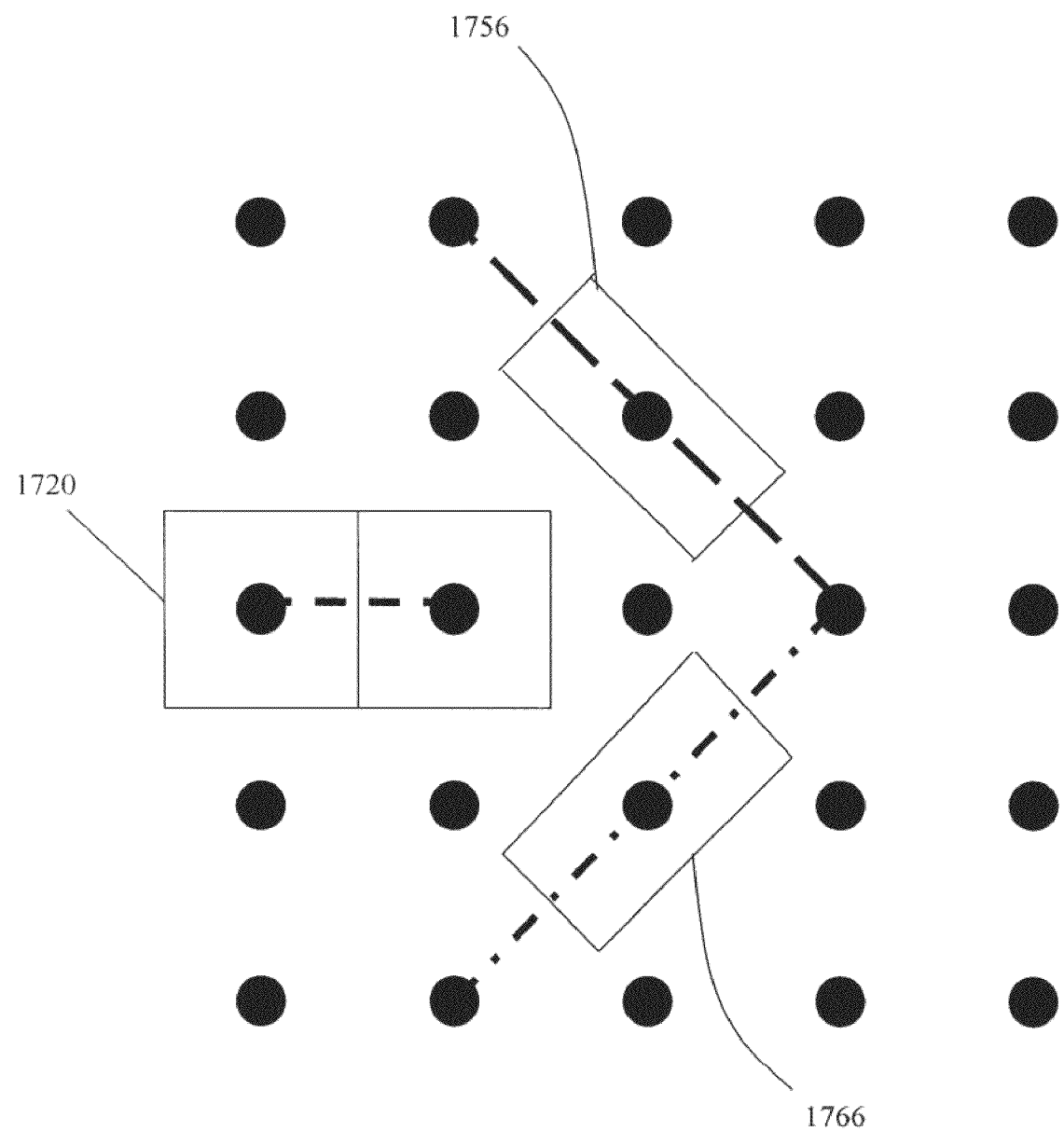

FIG. 17F illustrates all three types of Gcells overlaid onto a single set of nodes. Shown are Manhattan Gcells 1720, a 135 degree Gcell 1756, and a 45 degree Gcell 1766. It can be seen that shape of the 135 degree Gcell 1756 and the 45 degree Gcell 1766 are identical. The principle distinction between the 135 degree Gcell 1756 and the 45 degree Gcell 1766 is the orientation of the respective Gcells. In particular, the Gcells for the diagonal routing layers are rotated to the same angle as the preferred wiring direction of each layer. Therefore, the 45 degree Gcell 1766 is rotated to a 45 degree angle that is consistent with the preferred wiring direction of the 45 degree routing layer. The 135 degree Gcell 1756 is rotated to a 135 degree angle that is consistent with the preferred wiring direction of the 135 degree routing layer.

Figure 18A:
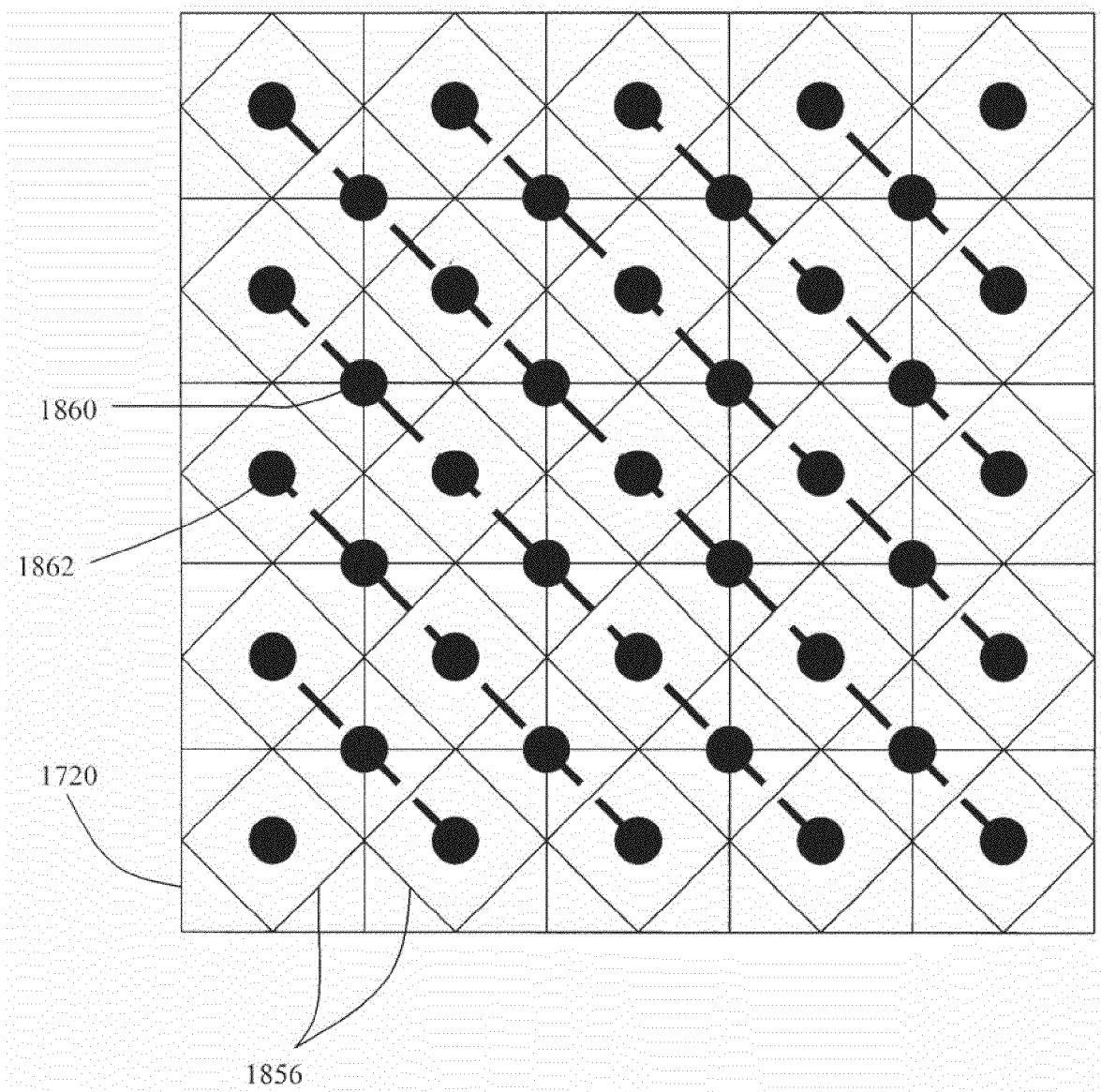
FIGS. 18A-D illustrate Gcells for a routing model having corner nodes.
Figure 18B:
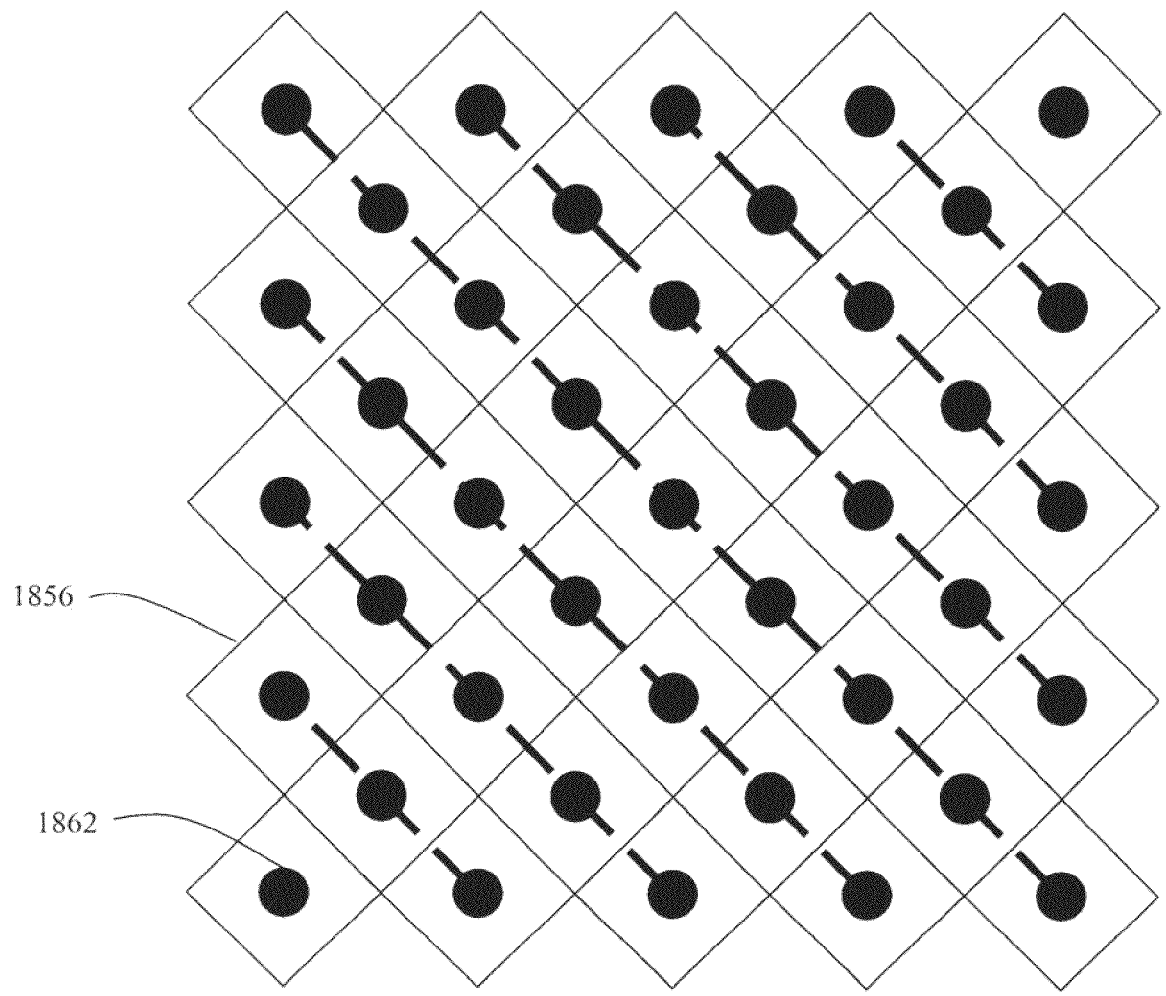

The Gcell shapes on the diagonal routing layers may differ if corner nodes are used. FIG. 18A shows a grid of 135 degree Gcells 1856 that have been overlaid onto a grid of Manhattan Gcells 1720. Because corner nodes 1862 are being modeled, the diagonal 135 degree Gcells 1856 shown in FIG. 18A are smaller than the 135 degree Gcells 1756 shown in FIG. 17B. This is because the area and shape encompassed by the Gcell 1856 corresponding to each node are configured to be consistent, including Gcells corresponding to both center nodes 1860 and corner nodes 1862. As a result, more Gcells 1756 are modeled if corner nodes 1862 are used, at least by comparison to an approach in which corner nodes are not used. In essence, the Gcells 1856 have the same size, shape, and orientation as the inscribed diamond shown in FIG. 13A. FIG. 18B shows a grid of 135 degree Gcells 1856 as they would be modeled for a 135 degree routing layer if corner nodes 1862 are used.

Figure 18C:
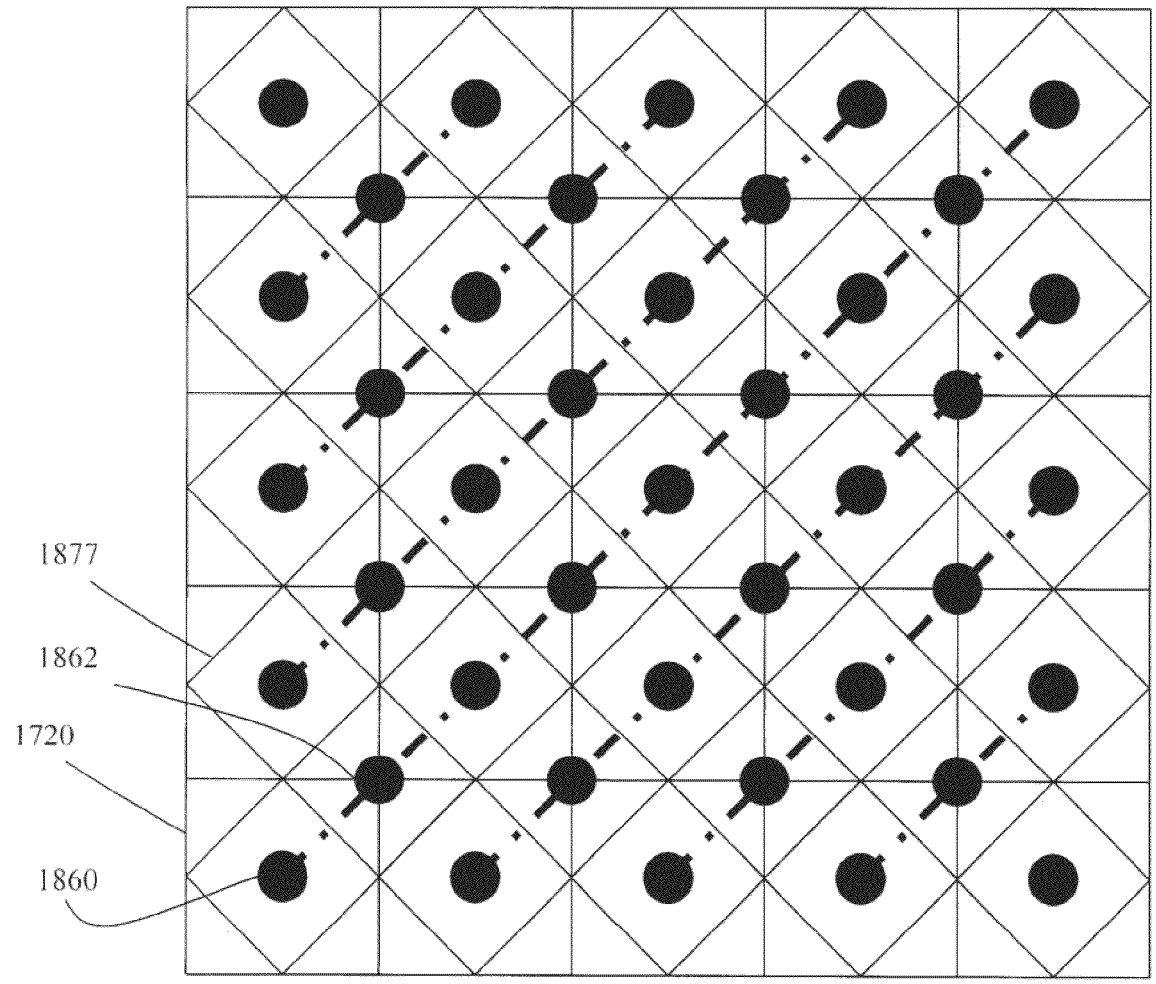
Figure 18D:
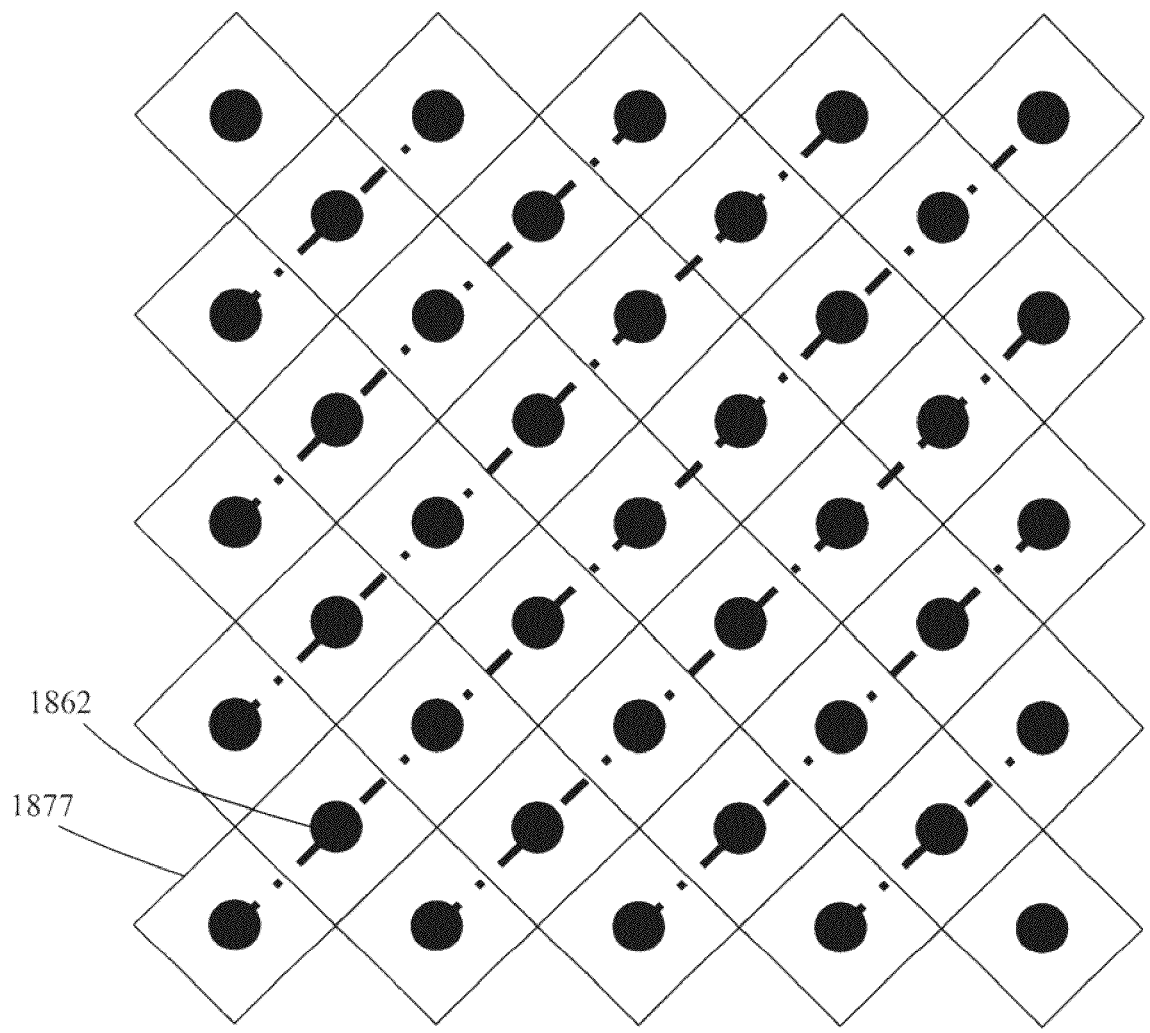

Similarly, when corner nodes 1862 exist, FIG. 18C shows a grid of 45 degree Gcells 1877 that have been overlaid onto a grid of Manhattan Gcells 1720. Because corner nodes 1862 are being used, the diagonal 45 degree Gcells 1877 shown in FIG. 18C are smaller than the 45 degree Gcells 1766 shown in FIG. 17D. As a result, more 45 degree Gcells are modeled by comparison if corner nodes 1862 are used. The Gcells 1877 have the same size, shape, and orientation as the inscribed diamond shown in FIG. 12B. FIG. 18D shows a grid of 45 degree Gcells 1877 as they would be modeled for a 45 degree routing layer if corner nodes 1862 are used. It is noted that the 45 degree Gcells 1877 and the 135 degree Gcells 1856 have identical shapes, and areas.

It is noted that the Gcells may have different Gcell boundaries on the different layers.

Figure 19A:
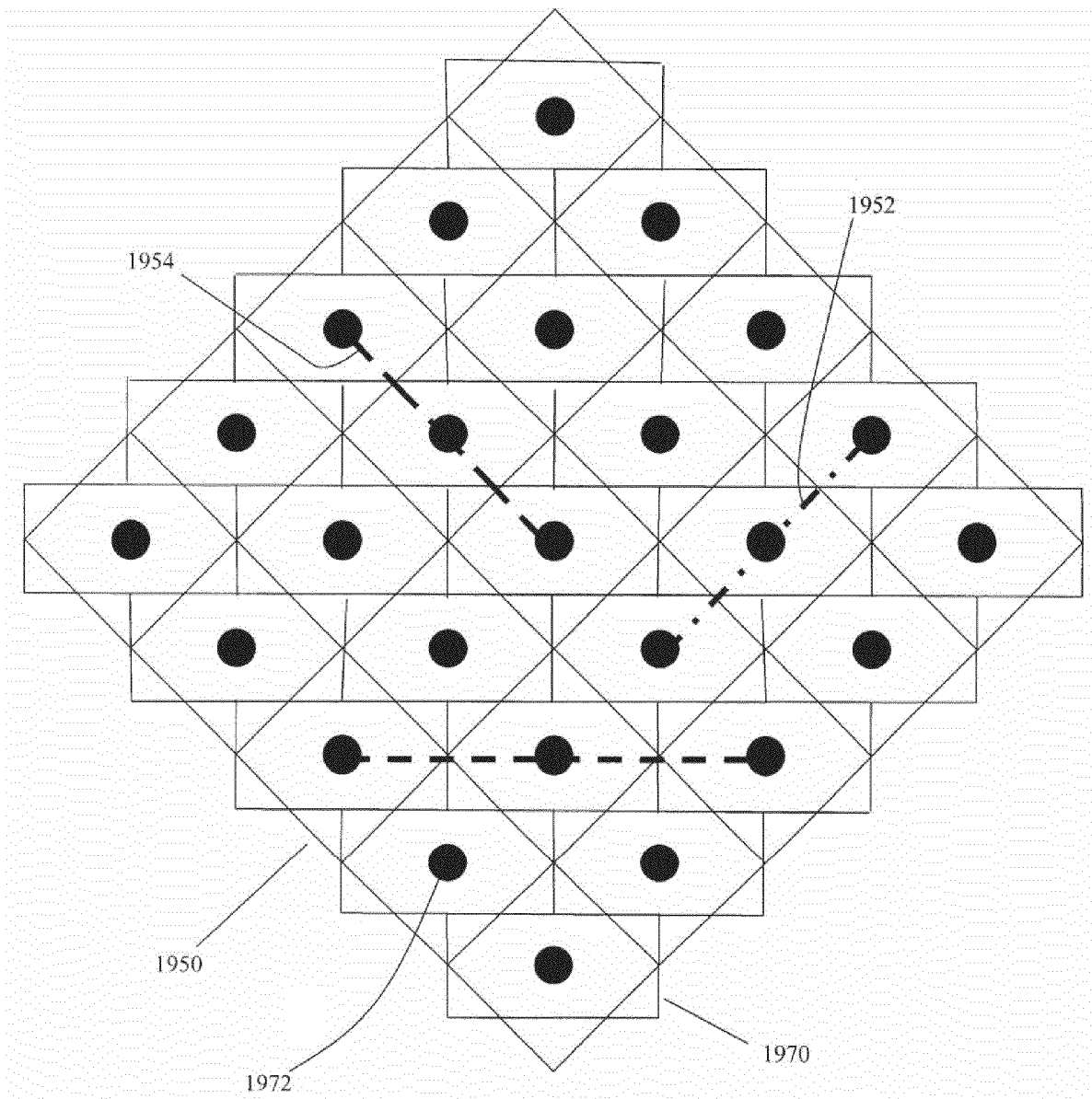
FIGS. 19A-B illustrate alternate Gcell implementations.
Figure 19B:
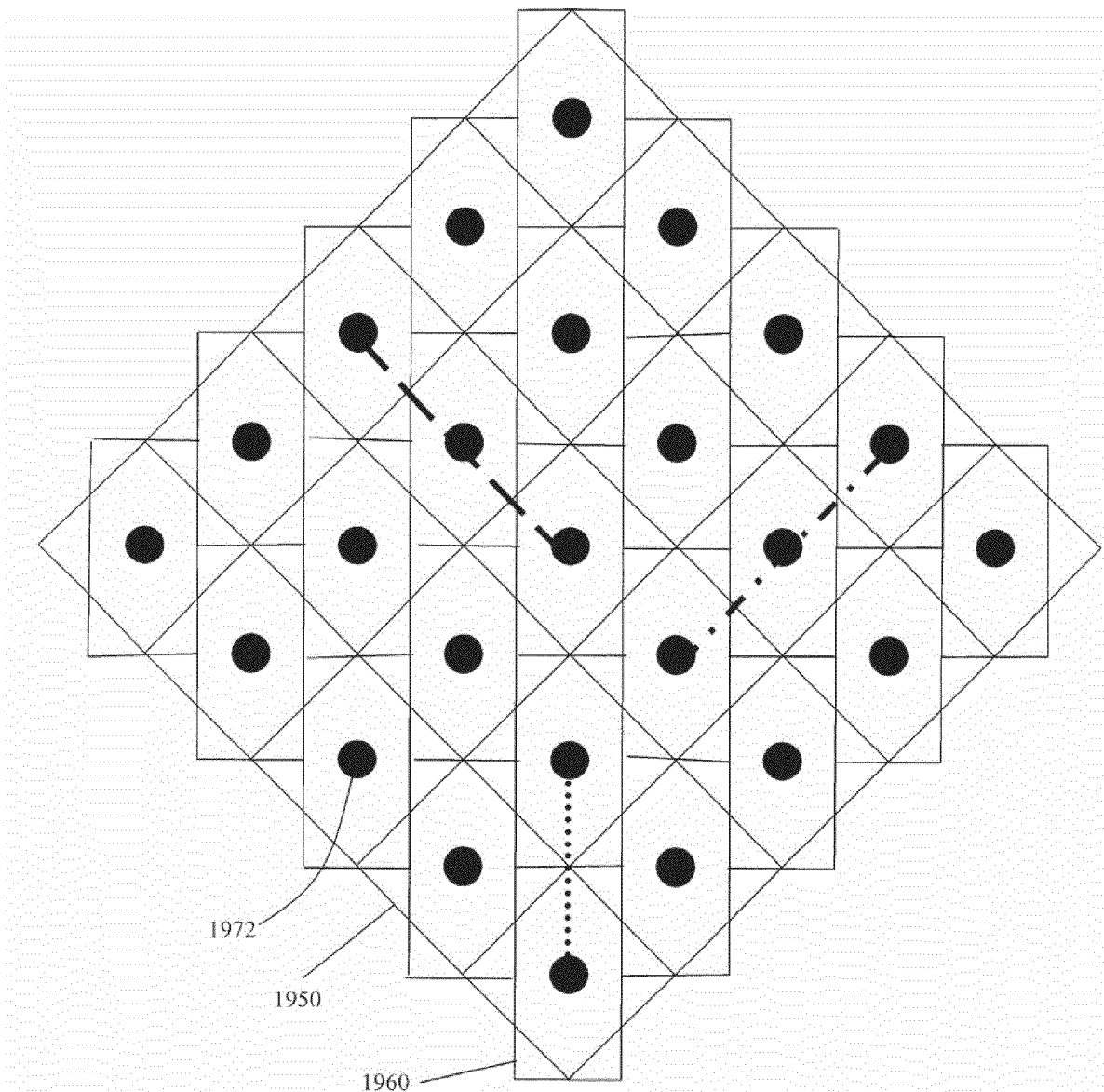

FIGS. 19A and 19B show an alternate embodiment in which square Gcells 1950 are used to model diagonal routing paths on diagonal routing layers. The square Gcells 1950 are rotated to match the preferred wiring direction of the respective wiring layers. Assume that the diagonal wiring layers have 45 degree and 135 degree preferred wiring directions. Since a square Gcell 1950 that has been rotated 135 degrees will appear the same as one rotated 45 degrees, the grid of square Gcells 1950 shown in FIG. 19A can be equally used to model routing on either the 45 degree wiring layer 1952 or the 135 degree wiring layer 1954.

FIG. 19A illustrates how the horizontal wiring layers can be modeled using rectangular Gcells 1970. Each horizontal Gcell 1970 is shaped as an elongated rectangle which has a longer length along the preferred horizontal wiring direction. The Gcells 1970 in the lengthwise direction correspond to boundaries that are equidistant between the nodes 1972. Adjacent Gcells 1970 in the non-lengthwise directions are offset from one another.

Similarly, FIG. 19B illustrates how the vertical wiring layers could be modeled using rectangular Gcells 1960. Each vertical Gcell 1960 is shaped as an elongated rectangle which has a longer length along the preferred vertical wiring direction. The Gcells 1960 in the lengthwise direction correspond to boundaries that are equidistant between the nodes 1972. Adjacent Gcells 1960 in the non-lengthwise directions are offset from one another.

Essentially, the approach of FIGS. 19A and 19B are rotated versions of the grids illustrated in FIG. 17C, where the rotated square Gcells are used to model diagonal routes and the rectangular Gcells are used to model the Manhattan routes. As such, the shapes of the vertical and horizontal Gcells are identical, with the principle distinction between the vertical degree Gcell and the horizontal Gcell is in the orientation of the respective Gcells.

Figure 20A:
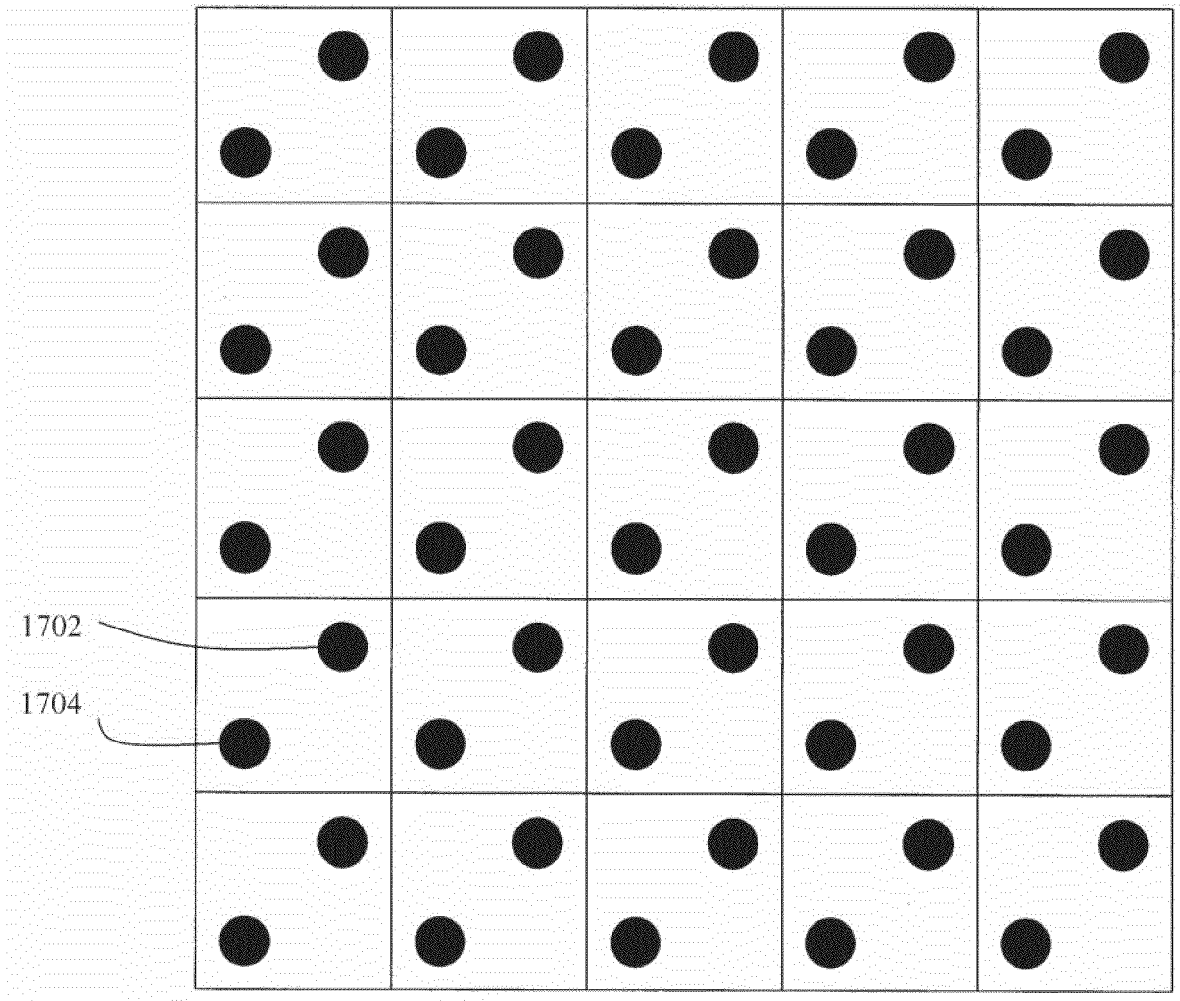
FIG. 20A-C and 21A-C show cells having two nodes.
Figure 20B:
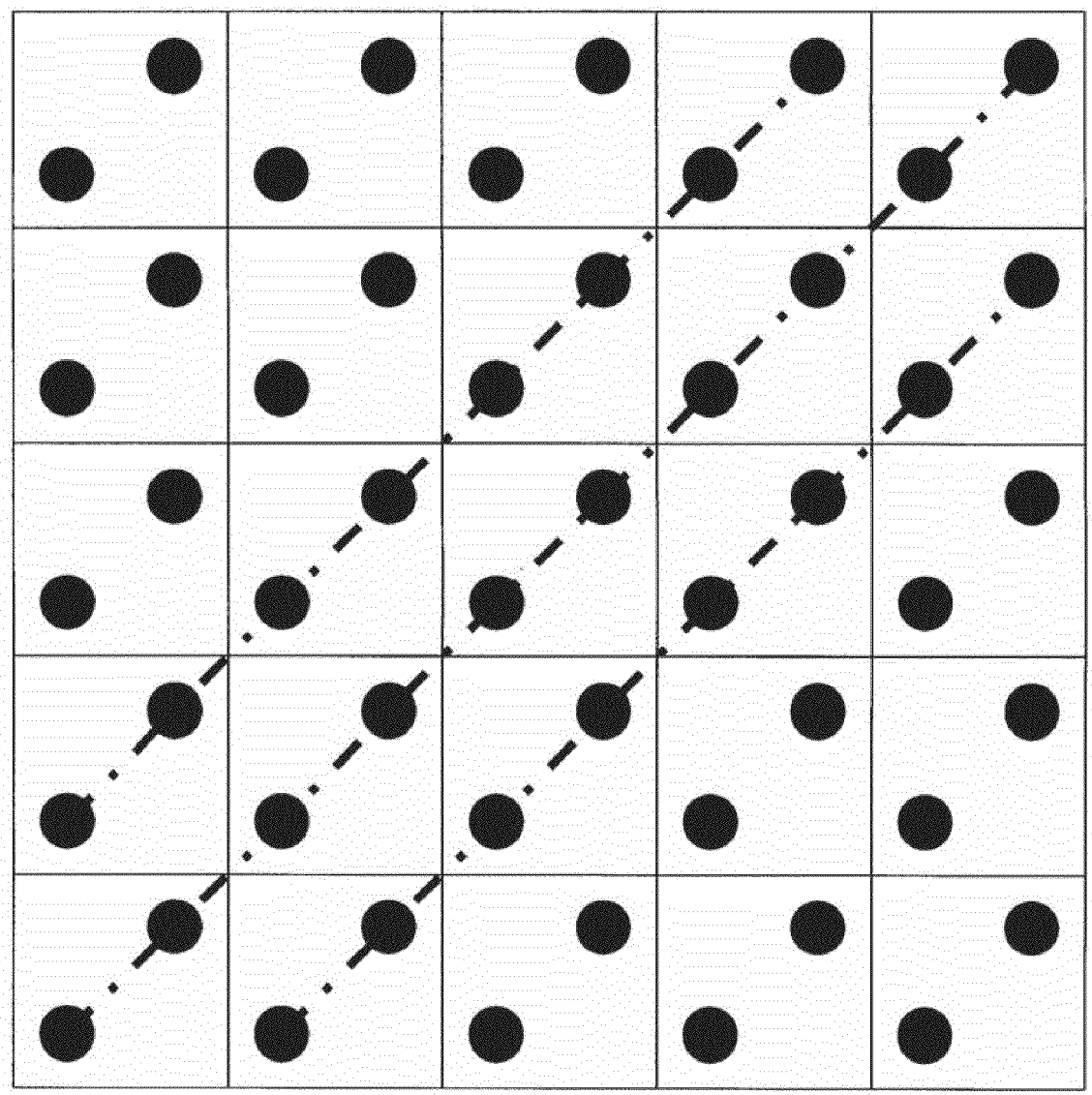
Figure 20C:
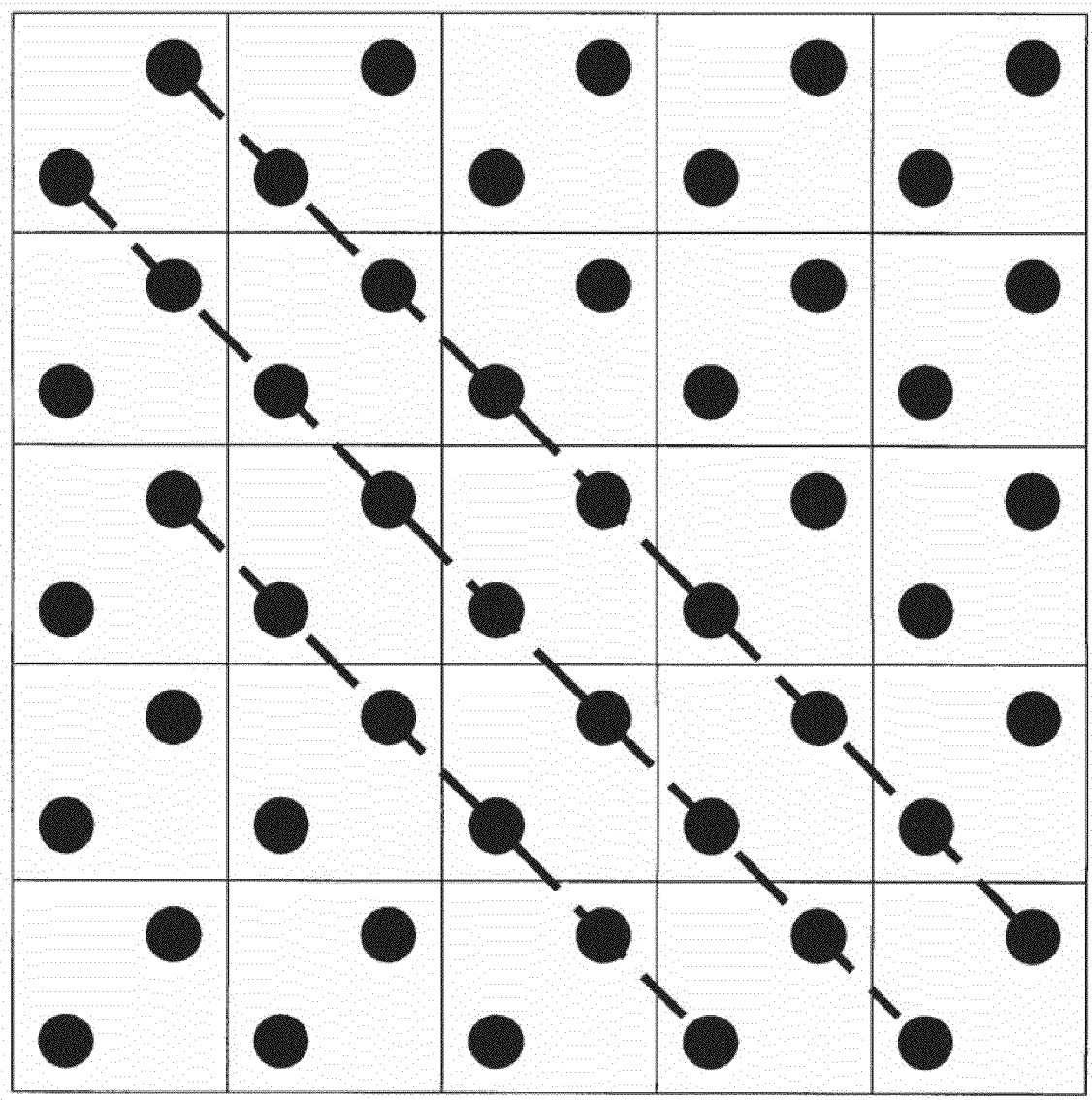

The invention is not limited to models having only a single node within a Gcell. FIG. 20A shows an embodiment in which a Gcell includes two nodes 1702 and 1704 in a diagonal pattern. FIG. 20B shows the embodiment in which routing paths are defined on the 45 degree diagonal routing layers. FIG. 20C shows the embodiment in which routing paths are defined on the 135 degree diagonal routing layer.

Figure 21A:
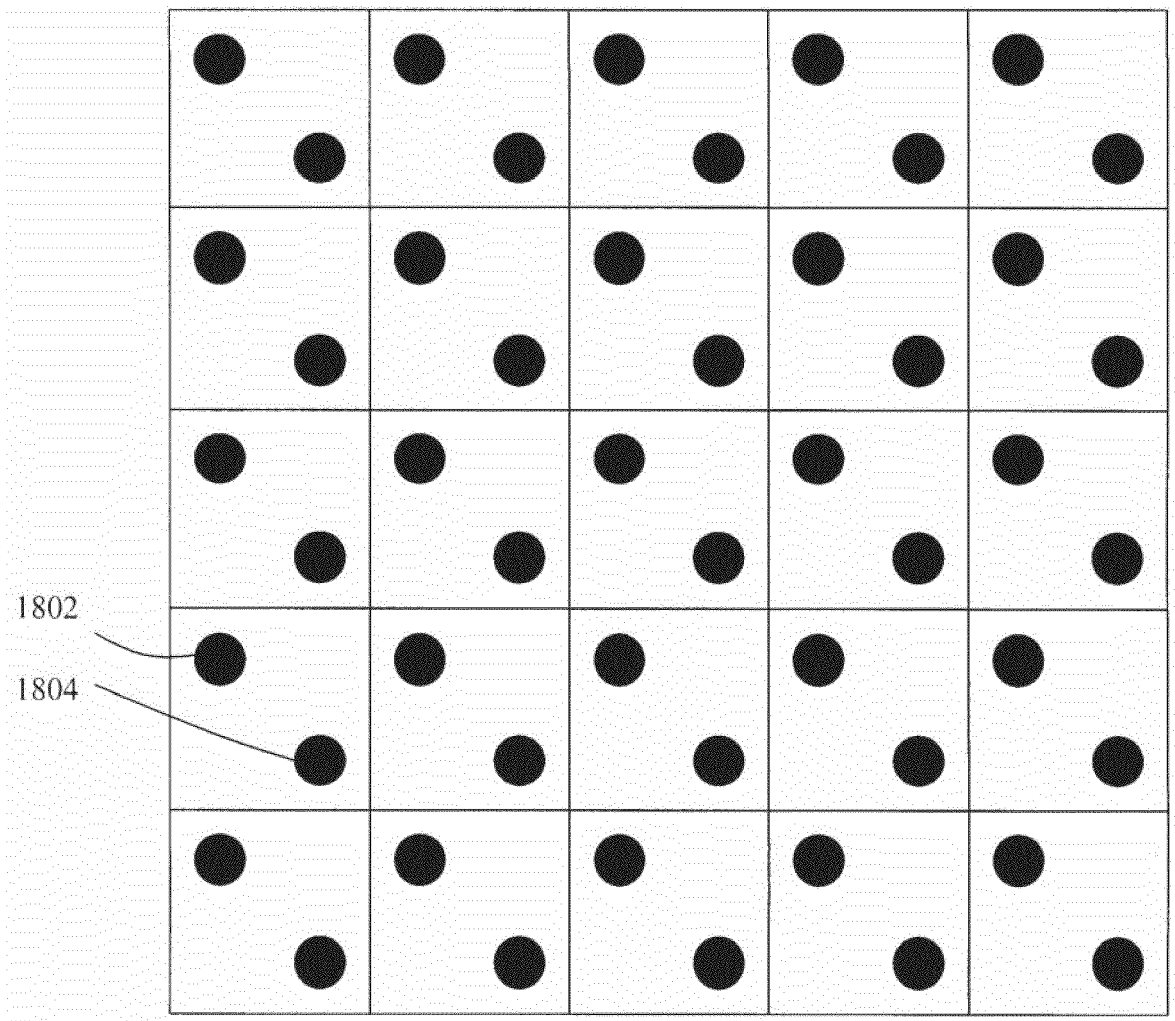
Figure 21B:
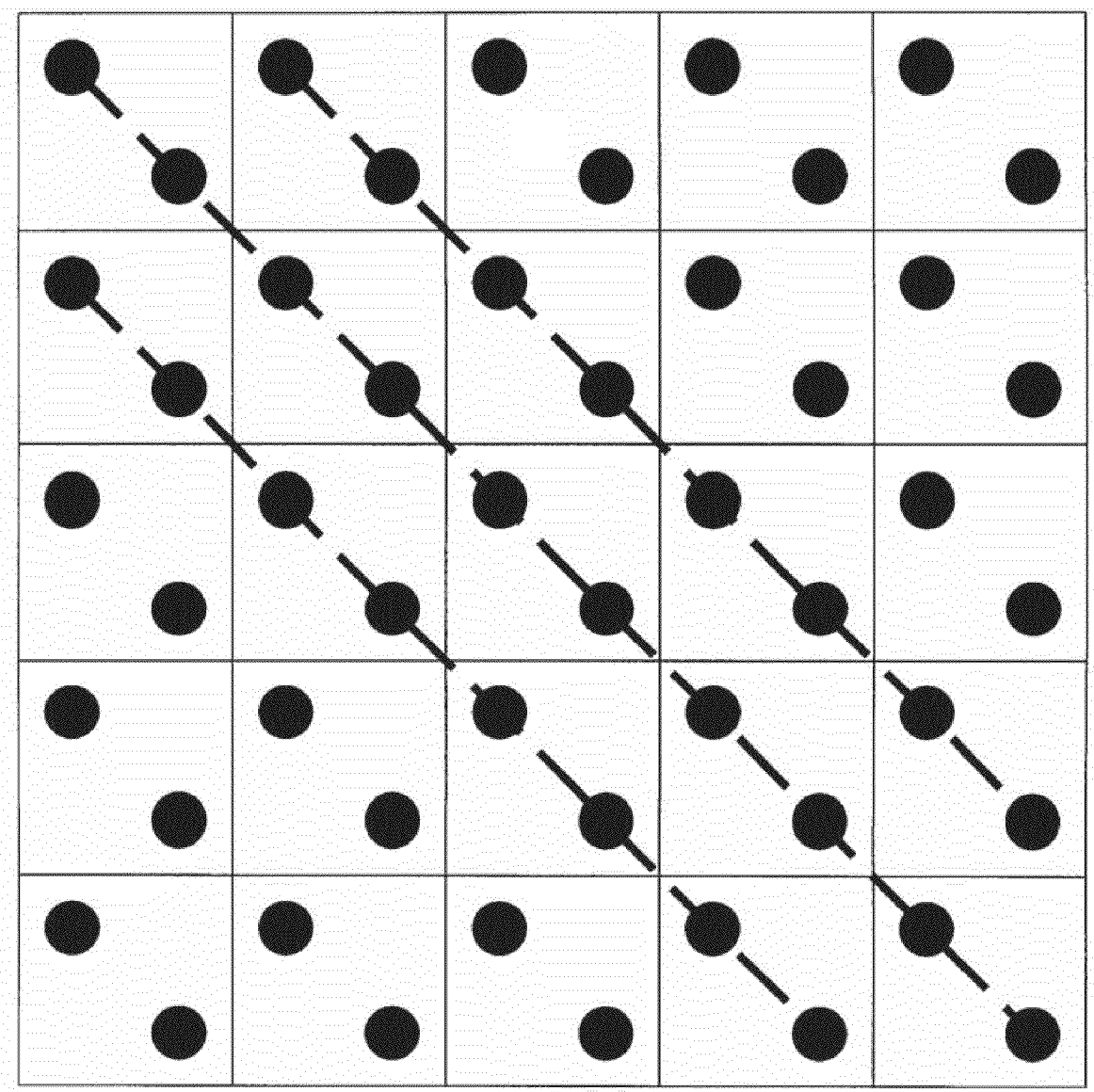
Figure 21C:
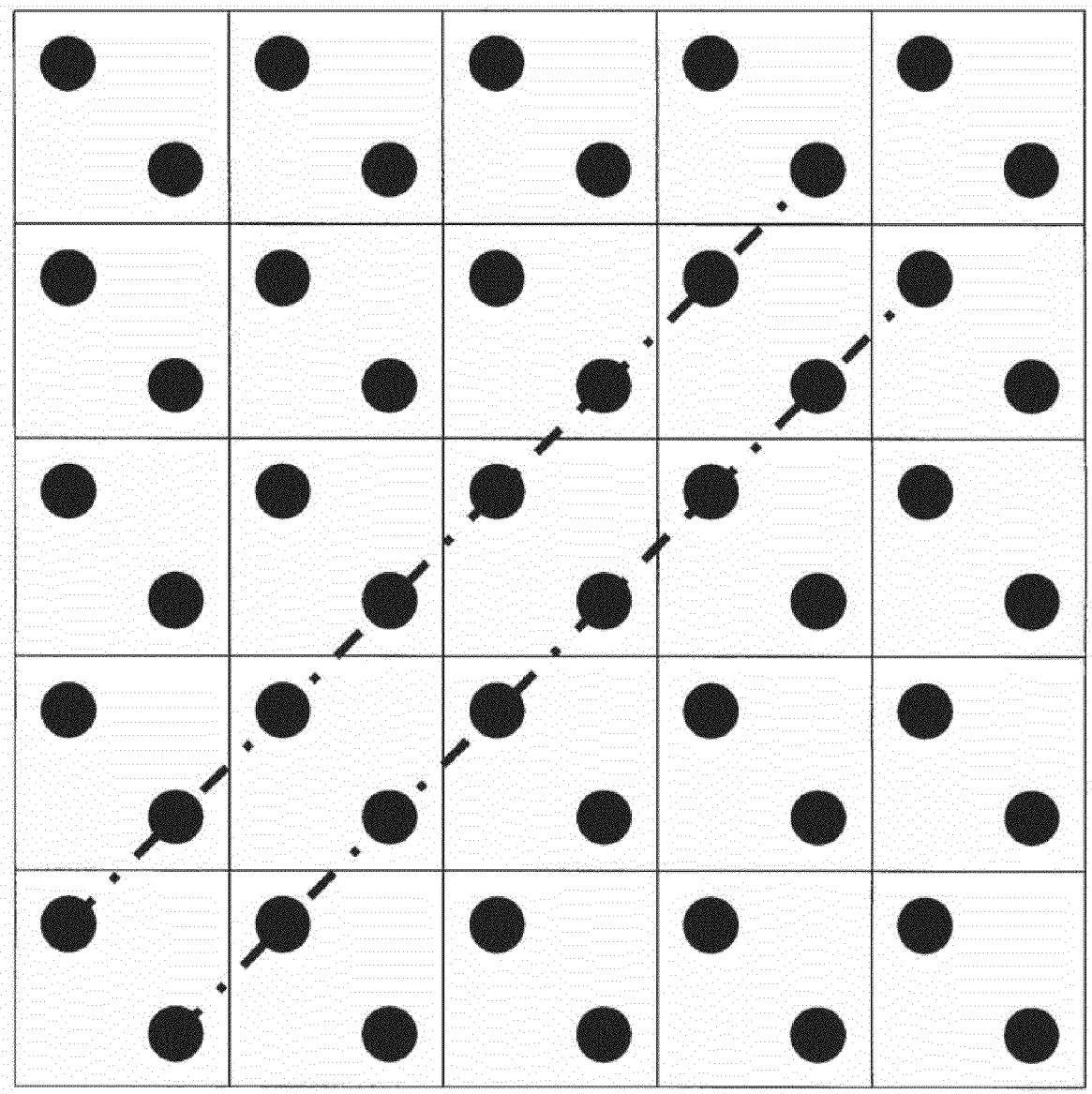

Similarly, FIG. 21A shows an embodiment in which a Gcell includes two nodes 1802 and 1804 in the opposite diagonal pattern. FIG. 21B shows the embodiment in which routing paths are defined on the 135 degree diagonal routing layers. FIG. 21C shows the embodiment in which routing paths are defined on the 45 degree diagonal routing layer.

In this approach, all connection points, e.g., pins and terminals, within the Gcell are consistently represented by one of the two nodes, e.g. the lower left bottom node 1704. This is true in some embodiments even if the pin is actually closer to the node 1702 in the Gcell, or to a closer corner node if corner nodes are being used. In an alternate embodiment, pins and terminals are represented by the nearest node to that pin or terminal.

Congestion Analysis

The general goal of congestion analysis is to identify, determine, and analyze the blockage conditions associated with routing between one point and another point. In some cases, it is very important to know the conditions associated with the boundaries between two Gcells.

The improved model representation of the present invention provides improvements for congestion analysis. In particular, the present model moves beyond any restrictions of prior approaches that require measurement of congestion at Manhattan boundaries. Instead, the process of congestion analysis can be made more naturally and efficiently with respect to diagonal routing paths.

In some embodiments, capacity calculations on diagonal layers are rotated in the angle of the preferred routing direction for that layer. For example, for layers that have a preferred direction of 45 degrees with respect to Manhattan layers, the capacity calculations are performed rotated to 45 degrees. The location of the calculations in this approach is not restricted to measurement at Manhattan boundaries.

Figure 22A:
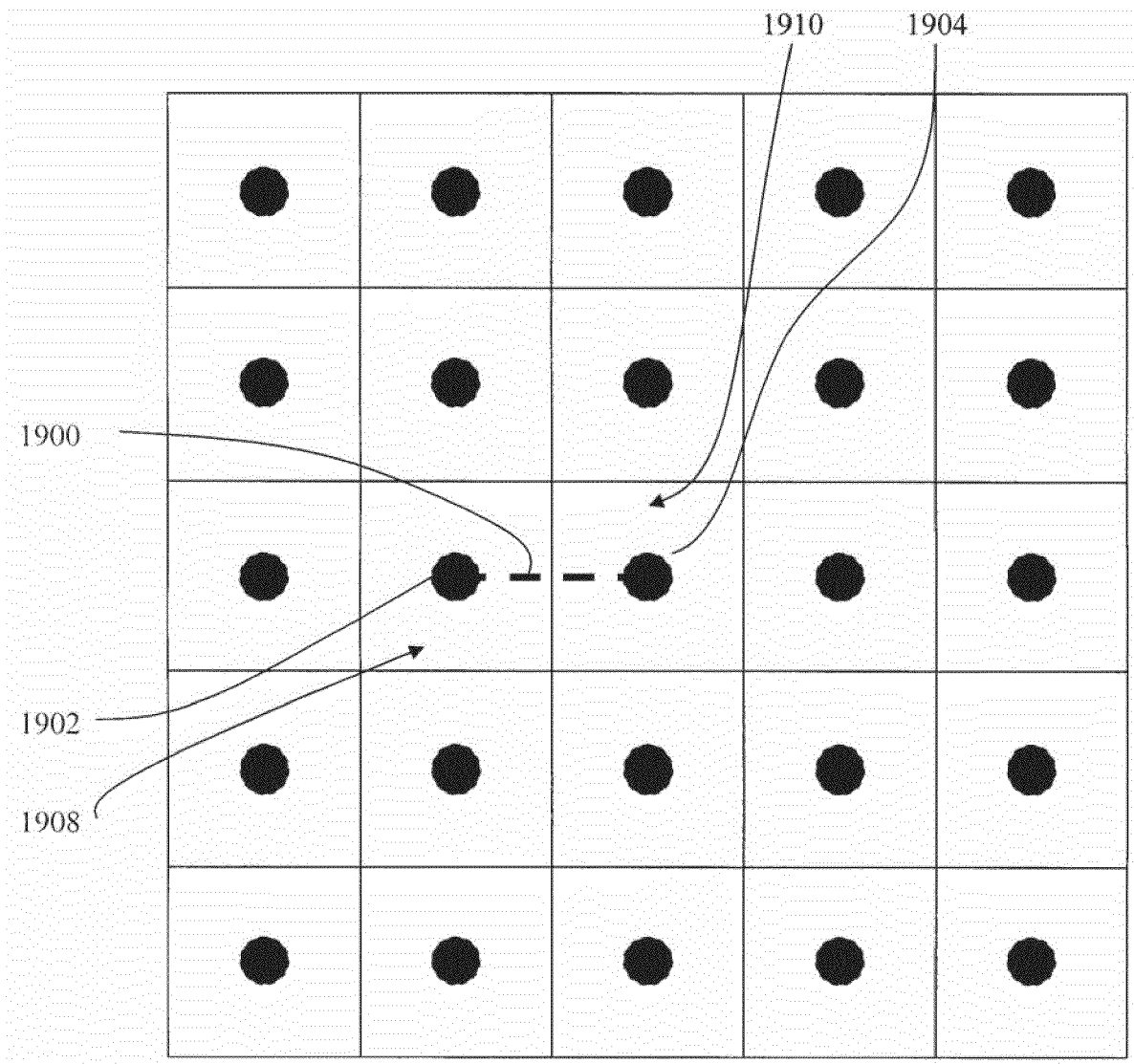
FIGS. 22A-B illustrate an approach for analyzing congestion on a Manhattan wiring layer.

Before describing congestion calculations for diagonal layers, it is helpful to first explain how such analysis can be performed on Manhattan routing layers. FIG. 22A shows an example horizontal routing path 1900 between node 1902 in Gcell 1908 and node 1904 in Gcell 1910 on a horizontal Manhattan routing layer.

Figure 22B:
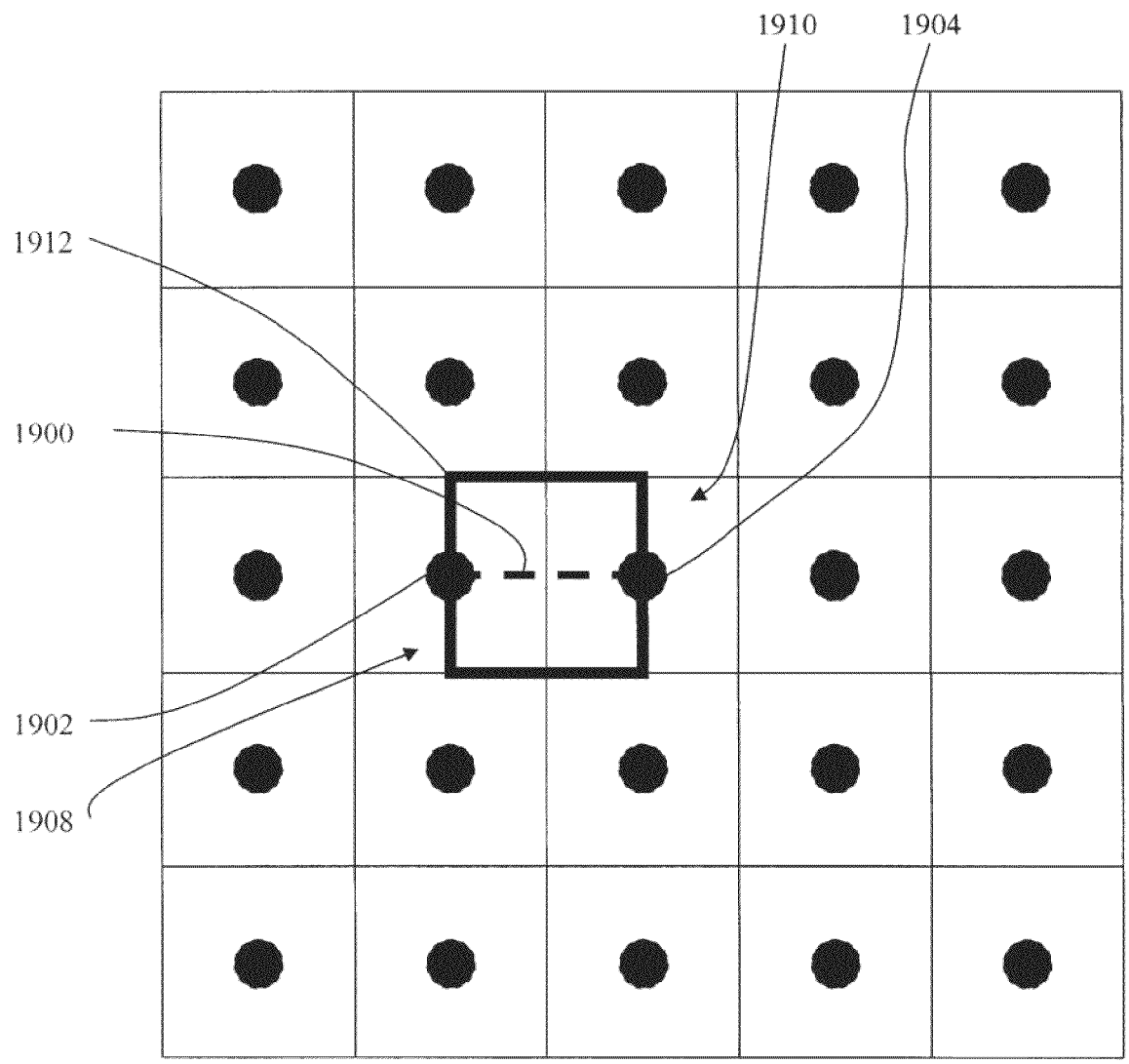

One approach to congestion analysis is to draw a region of import/interest around the boundaries of the Gcells or areas of interest. FIG. 22B shows a rectangular bounding box 1912 that corresponds to Gcells 1908 and 1910, which would be the region of import/interest for the horizontal routing path 1900 between nodes 1902 and 1904. The region of interest comprises one half of each Gcell 1908 and 1910 corresponding to the nodes 1902 and 1904. The portion of the Gcells 1908 and 1910 that are included within the region of import/interest is the portion containing the route 1900.

An initial action for congestion analysis is to identify the obstacles in the box 1912 that would impact the ability for a route 1900 to cross the boundary from Gcell 1908 to Gcell 1910. Blockages anywhere within the box 1912 are considered for this step of congestion analysis. The idea is that this step would identify the portions of the Gcells within box 1912 which are not eligible for routing purposes.

Capacity would then be determined for the space within box 1912, which corresponds to the availability of locations for routes between Gcell 1908 and 1910. Taking the identified blockages into account, possible tracks within the box 1912 are considered to determine whether any of the possible tracks would be suitable candidates for routing. Different parameters may be considered to determine the suitability of any particular track, e.g., distance, spacing, and size parameters. Capacity would be the measure of how many tracks are available for routing.

One example approach that an be taken to perform congestion analysis is described in U.S. Pat. No. 7,080,342, which is hereby incorporated by reference in its entirety.

Figure 23A:
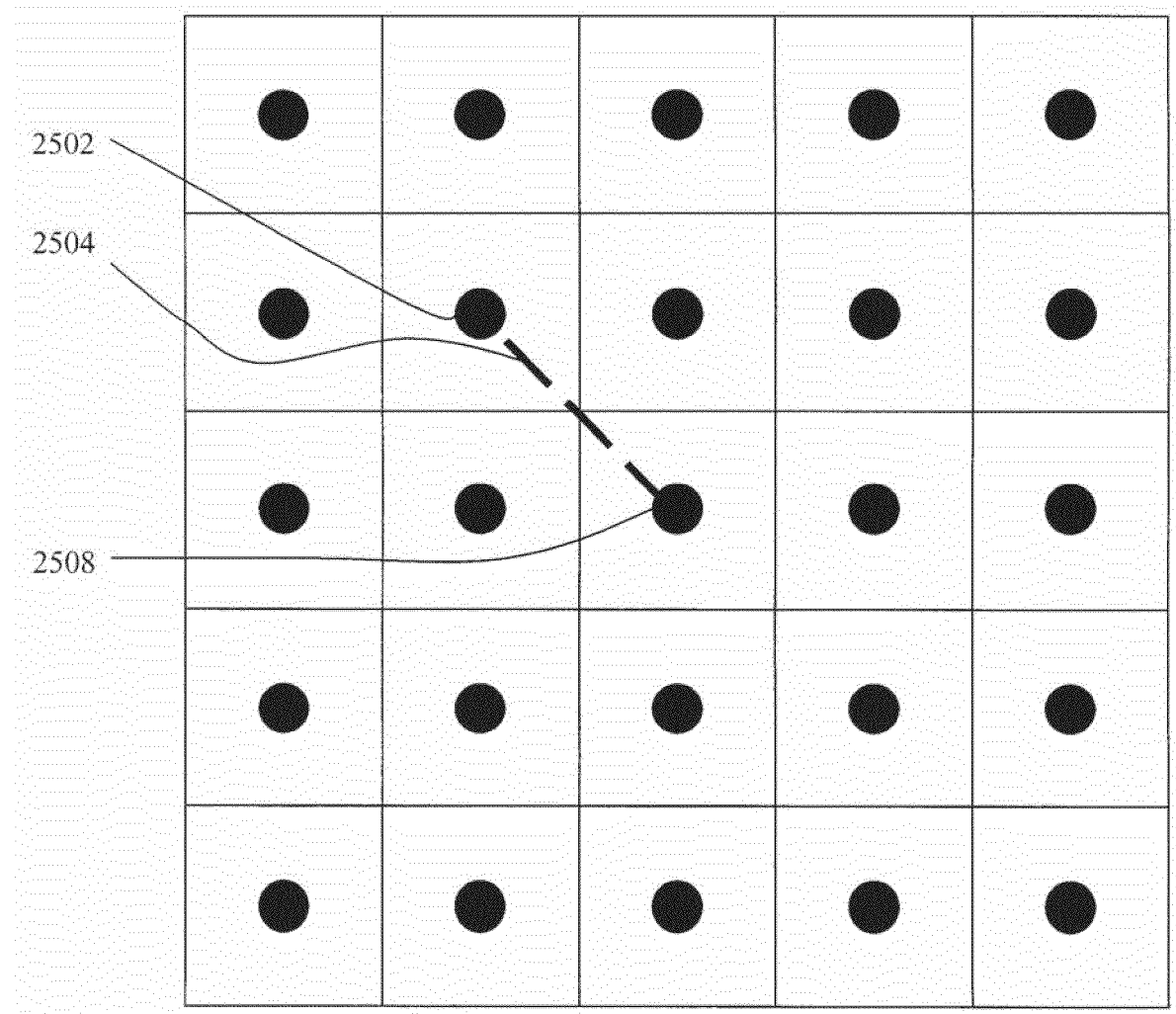
FIGS. 23A-B illustrate an approach for analyzing congestion on a diagonal wiring layer.

According to some embodiments, congestion analysis for diagonal routing paths is performed in a similar way, but applied consistent with the particular Gcell used for the preferred direction of the layer of interest. Shown in FIG. 23A is an example diagonal routing path 2504 between center node 2502 and center node 2508. The diagonal routing path 2504 is on the 135 degree diagonal routing layer.

Figure 23B:
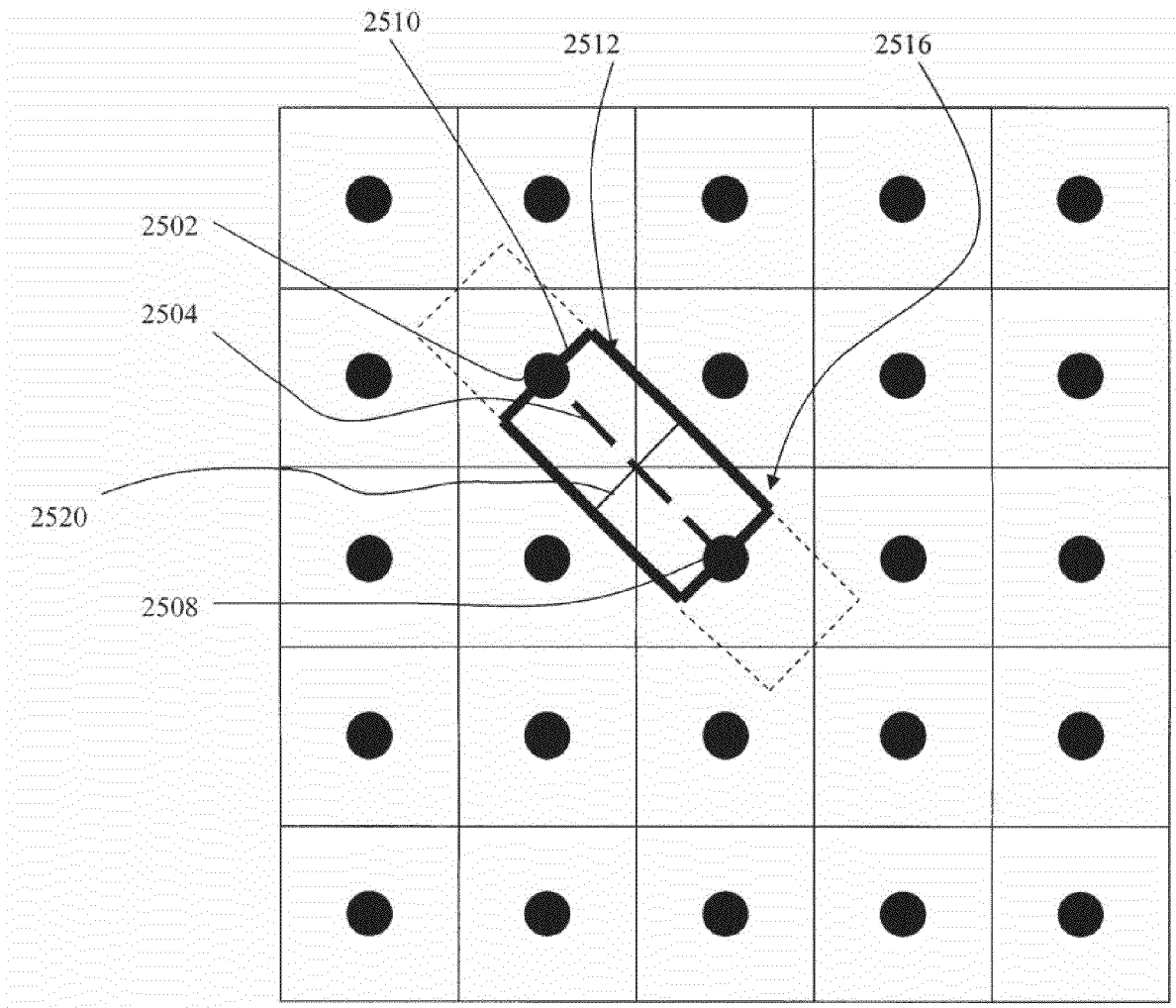

Similar to the approach for Manhattan layers, the capacity analysis process for diagonal layers is implemented by drawing a region of import/interest around the boundaries of the areas of interest. Referring to FIG. 23B, the areas of interest corresponds to one half of each Gcell 2512 and 2516 that corresponds to the nodes 2502 and 2508. The portion of the Gcells 2516 and 2512 that are included within the region of import/interest is the portion containing the routing path 2504. The resulting area of interest is box 2510, a rectangle aligned with the preferred routing direction of the 135 degree wiring layer.

The next actions for congestion analysis would then proceed very similarly to the actions for congestion analysis on a Manhattan layer. Obstacles in the box 2510 would be identified which would impact the ability of a route to cross the boundary 2520 between the Gcells 2512 and 2516. Blockages anywhere within the box 2510 are considered for this step of congestion analysis. This would identify the portions of the region of interest which are not eligible for routing purposes. Capacity would then be determined for the space within box 2510, which corresponds to the availability of locations for routes. Taking the identified blockages into account, possible tracks within the box 2510 are considered to determine whether any of the possible tracks would be suitable candidates for routing. Different parameters may be considered to determine the suitability of any particular track, e.g., distance, spacing, and size parameters. Capacity would be the measure of how much many tracks are available for routing.

In this way, congestion analysis can be directly performed along diagonal boundaries for diagonal routes, without requiring transitions to Manhattan routes/analysis. Moreover, the location for the diagonal congestion analysis is performed without requiring the measurement to coincide with a Manhattan boundary location. This provides a more natural way of performing such analysis.

Figure 24A:
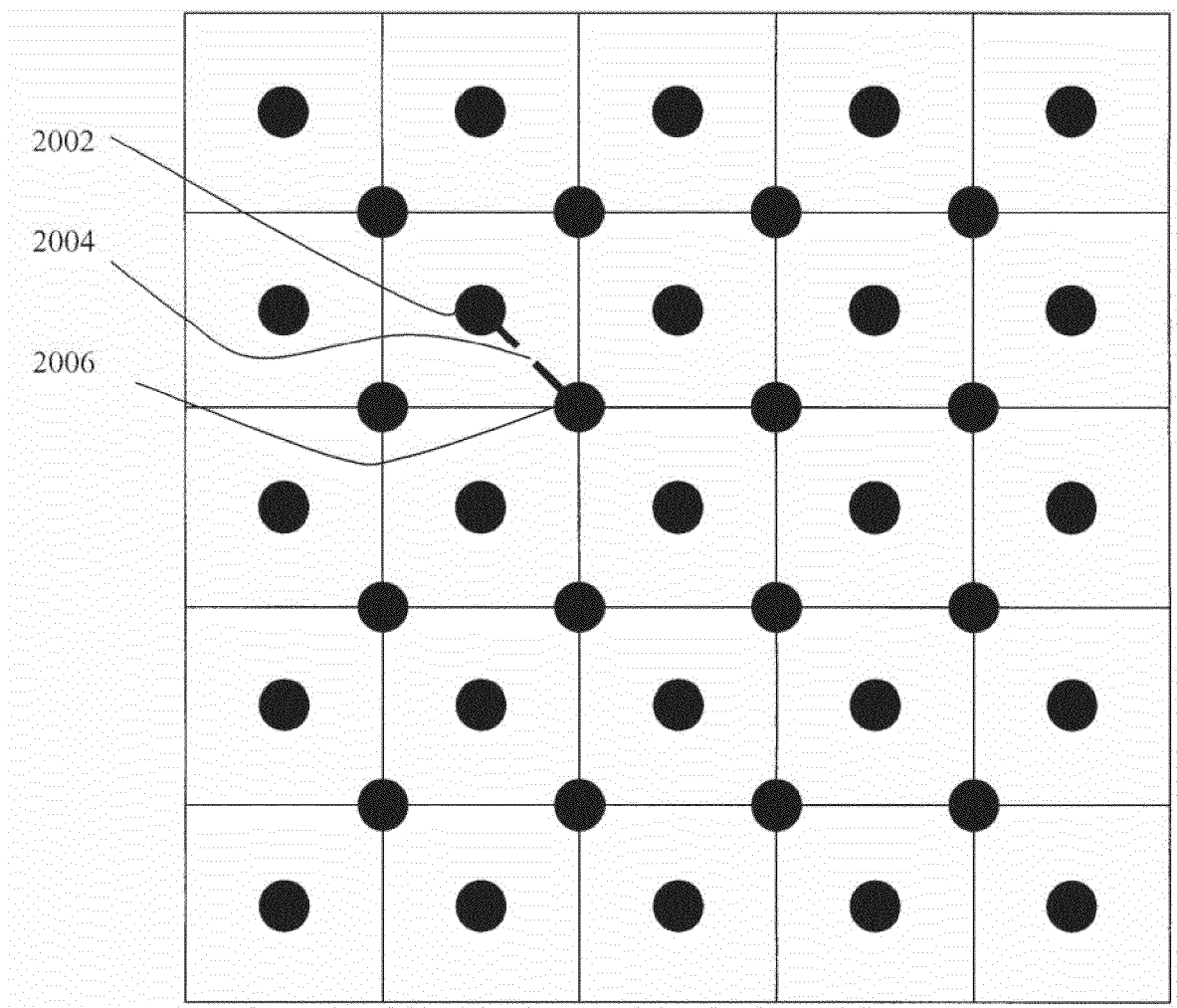
FIGS. 24A-B illustrate an approach for analyzing congestion on a diagonal wiring layer using corner nodes.
Figure 24B:
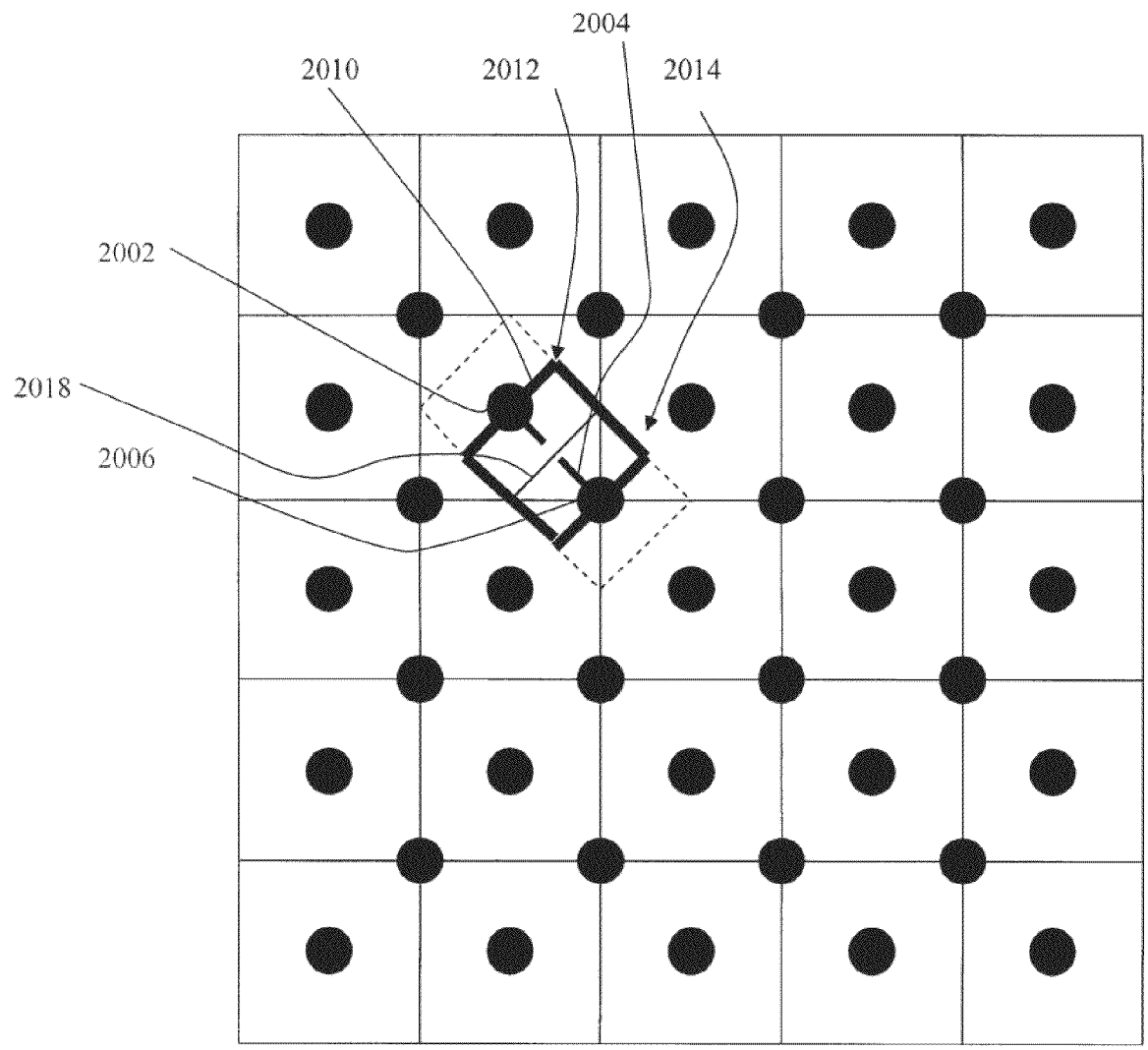

FIGS. 24A and 24B illustrate an approach for congestion analysis when corner nodes are used. FIG. 24A shows an example diagonal routing path 2004 between a center node 2002 and a corner node 2006. The diagonal routing path 2004 is on the 135 degree diagonal routing layer.

Similar to the approach previously described, capacity analysis process is implemented by drawing a region of import/interest around the boundaries of the areas of interest. Referring to FIG. 24B, the area of interest corresponds to one half of each Gcell 2012 and 2014 that corresponds to the nodes 2002 and 2006. The portion of the Gcells 2012 and 2014 that are included within the region of import/interest is the portion containing the routing path 2004. The resulting region of interest is a square box 2010, aligned with the preferred routing direction of the 135 degree wiring layer.

It is noted that the region of interest for the approach shown in FIG. 24B is smaller than the region of interest shown in FIG. 23B. This is because the Gcells are smaller when corner nodes are employed. This provides a resolution difference between the analysis of diagonal layers with corner nodes and without corner nodes. In effect, the smaller region of interest for the corner node approach provides increased resolution when performing congestion analysis on diagonal layers.

Figure 25:
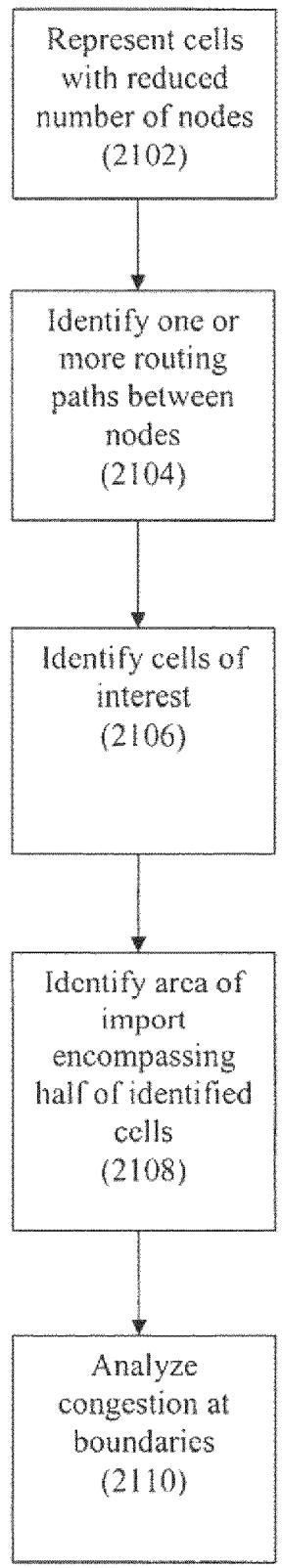
FIG. 25 shows a flowchart of a process for routing, modeling, and congestion analysis according to some embodiments of the invention.

FIG. 25 shows a flowchart of an approach for performing congestion analysis according to some embodiments of the invention. At 2102, the process begins with a representation of cells having a reduced number of nodes. In one embodiment, this action corresponds to each cell having a single node, preferably in the center of the cell. In alternate embodiments, this action corresponds to cells having two angled nodes. In other embodiments, this action corresponds to any cell having less than three nodes. Corner nodes may be utilized at the intersection point of cells.

At 2104, the process continues by identifying one or more routing paths between nodes. Based upon the routing path, cells of interest are identified at 2106. For example, for Manhattan routing paths, this action would identify the Gcells corresponding to the routing path. In some embodiments, cells on two or more different layers may correspond to different shapes, dimensions, sizes, and/or orientations.

An area of import is identified at 2108 based upon the identified cells of interest. The area of import may be defined to include one half of each cell of interest. The area of import/interest includes the portions of the identified cell which include the identified routing path(s). In alternate embodiments, either smaller or larger portions of the cells may be included within the identified area of import/interest. A bounding box can be drawn around the boundaries of the area of import.

Thereafter, congestion may be analyzed within the bounding boxes. In one approach, congestion is analyzed at the boundaries between cells within the bounding box. Any suitable approach may be used to perform congestion analysis. One suitable approach for congestion analysis is described in U.S. Pat. No. 7,080,342, which is hereby incorporated by reference in its entirety. The resulting routing graph, representation, and congestion analysis can then be used to route the circuit. One suitable approach for implementing routing is described in co-pending U.S. application Ser. No. 10/335, 180, filed on Dec. 31, 2002, which is hereby incorporated by reference in its entirety.

System Architecture Overview

Figure 26:
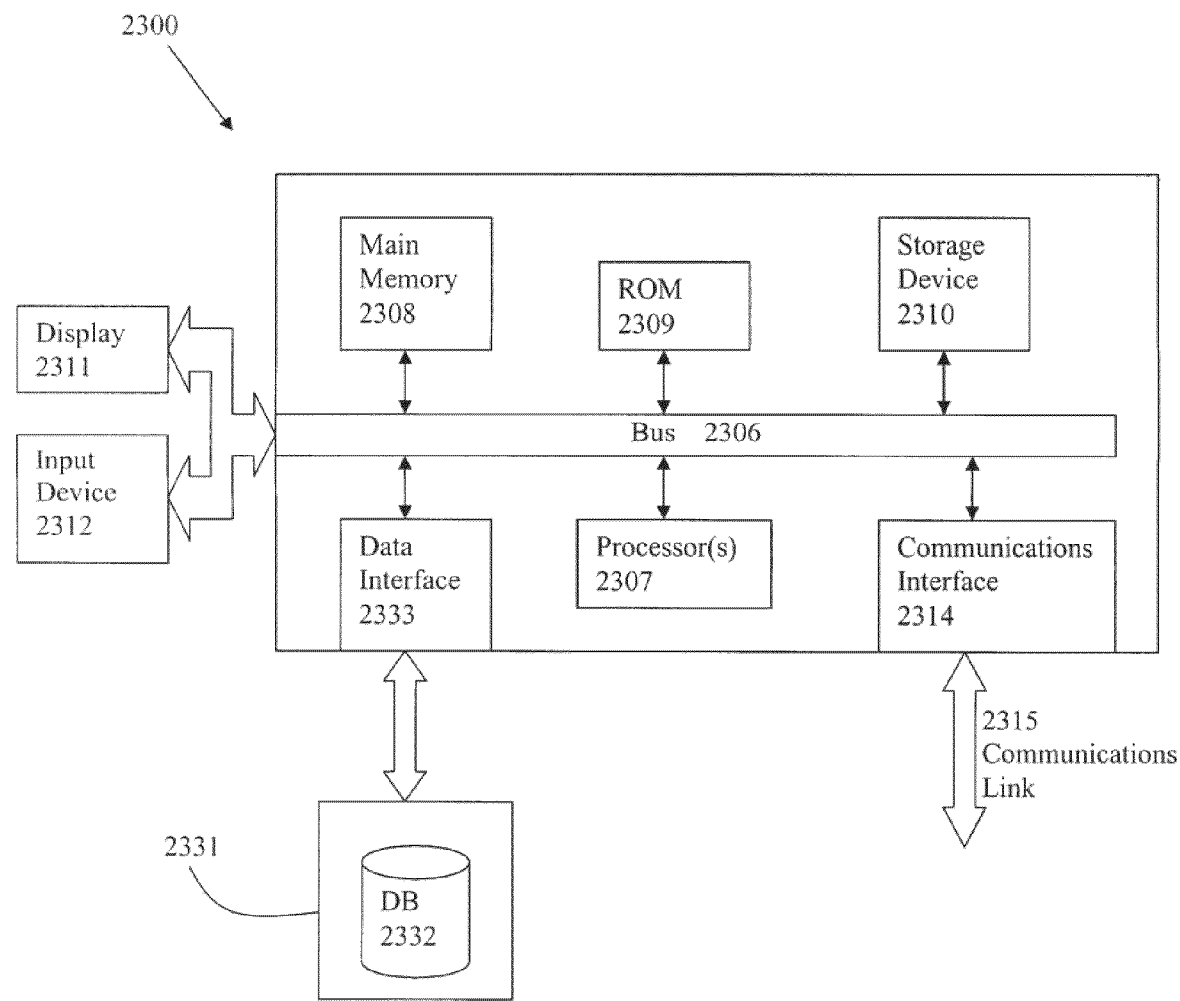
FIG. 26 shows an architecture of an example computing system with which the invention may be implemented.

FIG. 26 is a block diagram of an illustrative computing system 2300 suitable for implementing various embodiments of the invention. Computer system 2300 includes a bus 2306 or other communication mechanism for communicating information, which interconnects subsystems and devices, such as processor 2307, system memory 2308 (e.g., RAM), static storage device 2309 (e.g., ROM), disk drive 2310 (e.g., magnetic or optical), communication interface 2314 (e.g., modem or Ethernet card), display 2311 (e.g., CRT or LCD), input device 2312 (e.g., keyboard), and cursor control.

According to one embodiment of the invention, computer system 2300 performs specific operations by processor 2307 executing one or more sequences of one or more instructions contained in system memory 2308. Such instructions may be read into system memory 2308 from another computer readable/usable medium, such as static storage device 2309 or disk drive 2310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 2307 for execution. Such a medium may take many forms, including but not limited to, non-volatile media and volatile media. Non-volatile media include, for example, optical or magnetic disks, such as disk drive 2310. Volatile media include dynamic memory, such as system memory 2308.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2300. According to other embodiments of the invention, two or more computer systems 2300 coupled by communication link 2315 (e.g., LAN, PTSN, or wireless network) may perform the sequence of instructions required to practice the invention in coordination with one another.

Computer system 2300 may transmit and receive messages, data, and instructions, including program, i.e., application code, through communication link 2315 and communication interface 2314. Received program code may be executed by processor 2307 as it is received, and/or stored in disk drive 2310, or other non-volatile storage for later execution.

In an embodiment, the computer system 2300 operates in conjunction with a data storage system 2331, e.g., a data storage system 2331 that contains a database 2332 that is readily accessible by the computer system 2300. The computer system 2300 communicates with the data storage system 2331 through a data interface 2333. A data interface 2333, which is coupled to the bus 2306, transmits and receives electrical, electromagnetic, or optical signals that include data streams representing various types of signal information, e.g., instructions, messages, and data. In embodiments of the invention, the instructions of the data interface 2333 may be performed by the communication interface 2314.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for modeling cells for an integrated circuit design router, comprising:
   using at least one processor to perform a process, the process comprising:
   representing at least a portion of a layout with multiple cells by dividing the layout with a first set of grids;
   identifying a plurality of cells of the multiple cells from the layout;
   representing each cell of the plurality of cells with a set of nodes which comprises at least one node; and
   modeling routing among at least two cells of the plurality of cells by using at least a corner of a grid in the first set of grids of at least two cells of the plurality of cells based at least in part upon congestion analysis results determined by using at least the first set of grids, wherein
   each of the at least two cells is modeled with a grid having four or more edges for modeling the routing among the at least two cells.

2. The computer implemented method of claim 1, in which the at least one node comprises a single center node for each of the plurality of cells.

3. The computer implemented method of claim 1, further comprising:
   representing a corner node at a corner intersection of two or more of the plurality of cells.

4. The computer implemented method of claim 3, in which one or more transitions to or from a Manhattan wiring layer are made only at a center node.

5. The computer implemented method of claim 3, in which one or more transitions to or from a diagonal wiring layer can be made at either a center node or a corner node.

6. The computer implemented method of claim 5, in which the one or more transitions from the corner node are only made between diagonal wiring layers.

7. The computer implemented method of claim 1, in which a diagonal route is represented as a direct diagonal connection between nodes.

8. The computer implemented method of claim 1, in which congestion analysis is performed on a diagonal route without requiring association with a Manhattan layer gcell boundary.

9. A system for modeling cells for an integrated circuit design router, comprising:
   a computer system which comprises at least one processor to:
   represent at least a portion of a layout with multiple cells by dividing the layout with a first set of grids;
   identify a plurality of cells of the multiple cells from the layout;
   represent each cell of the plurality of cells with a set of nodes which comprises at least one node; and
   model routing among at least two cells of the plurality of cells by using at least a corner of a grid in the first set of grids of at least two cells of the plurality of cells based at least in part upon congestion analysis results determined by using at least the first set of grids, wherein
   each of the at least two cells is modeled with a grid having four or more edges for modeling the routing among the at least two cells.

10. An article of manufacture of a computer program product comprising a non-transitory computer readable storage medium having a sequence of instructions which, when executed by at least one processor of a computer system, causes the at least one processor to perform a method for modeling cells for an integrated circuit design router, the method comprising:
   using the computer system which comprises the at least one processor to perform a process, the process comprising:
   representing at least a portion of a layout with multiple cells by dividing the layout with a first set of grids;
   identifying a plurality of cells of the multiple cells from the layout;
   representing each cell of the plurality of cells with a set of nodes which comprises at least one node; and
   modeling routing among at least two cells of the plurality of cells by using at least a corner of a grid in the first set of grids of at least two cells of the plurality of cells based at least in part upon congestion analysis results determined by using at least the first set of grids, wherein each of the at least two cells is modeled with a grid having four or more edges for modeling the routing among the at least two cells.

11. The system of claim 9, wherein the computer system is further programmed for performing:
   representing a corner node at a corner intersection of two or more of the plurality of cells.

12. The system of claim 11, in which transitions to or from a Manhattan wiring layer are made only at a center node.

13. The system of claim 9, in which the at least one node comprises a single center node for the each cell.

14. The system of claim 11, in which congestion analysis is performed on a diagonal route without requiring association with a Manhattan layer gcell boundary.

15. The system of claim 11, in which one or more transitions to or from a diagonal wiring layer are characterized by being capable of being made at either a center node or a corner node.

16. The article of manufacture of claim 10, wherein the process further comprises:
   representing a corner node at a corner intersection of two or more of the plurality of cells.

17. The article of manufacture of claim 16, in which one or more transitions to or from a Manhattan wiring layer are made only at a center node.

18. The article of manufacture of claim 10, in which the at least one node comprises a single center node for the each cell.

19. The article of manufacture of claim 16, in which congestion analysis is performed on a diagonal route without requiring association with a Manhattan layer gcell boundary.

20. The article of manufacture of claim 16, in which one or more transitions to or from a diagonal wiring layer are characterized by being capable of being made at either a center node or a corner node.

21. The computer implemented method of claim 1, the process further comprising:
   enhancing distance resolution for routing the layout by using the corner without transitioning between a first grid and a second grid, wherein the corner is identified by a partitioning scheme that is used to partition the layout into the multiple cells.

22. The computer implemented method of claim 1, the process further comprising:
   determining capacity or congestion at a boundary between two cells of the plurality of cells by using at least a congestion edge that spans across the boundary.

* * * * *